(12) United States Patent
Wang

(10) Patent No.: US 9,349,433 B2
(45) Date of Patent: May 24, 2016

(54) HIDDEN REFRESH OF WEAK MEMORY STORAGE CELLS IN SEMICONDUCTOR MEMORY

(71) Applicant: INPHI CORPORATION, Santa Clara, CA (US)

(72) Inventor: David Wang, Westlake Village, CA (US)

(73) Assignee: INPHI CORPORATION, Santa Clara, CA (US)

( * ) Notice: Subject to any disclaimer, the term of this patent is extended or adjusted under 35 U.S.C. 154(b) by 0 days.

(21) Appl. No.: 14/175,857

(22) Filed: Feb. 7, 2014

(65) Prior Publication Data

US 2014/0269139 A1 Sep. 18, 2014

Related U.S. Application Data

(60) Provisional application No. 61/833,372, filed on Jun. 10, 2013, provisional application No. 61/780,800, filed on Mar. 13, 2013.

(51) Int. Cl.
| | |
|---|---|
| *G11C 8/00* | (2006.01) |
| *G11C 11/4063* | (2006.01) |
| *G11C 11/406* | (2006.01) |
| *G11C 11/4076* | (2006.01) |

(52) U.S. Cl.
CPC ........ *G11C 11/4063* (2013.01); *G11C 11/4076* (2013.01); *G11C 11/40611* (2013.01)

(58) Field of Classification Search
CPC ............... G11C 11/4063; G11C 11/40611; G11C 11/4076
USPC ............... 365/185.11, 200, 203, 204, 230.03, 365/233.13, 236
See application file for complete search history.

(56) References Cited

U.S. PATENT DOCUMENTS

| | | | | |
|---|---|---|---|---|
| 6,343,352 B1* | 1/2002 | Davis | ................... | G06F 13/1626 365/194 |
| 2013/0282973 A1* | 10/2013 | Kim | ................. | G11C 11/40622 711/106 |

* cited by examiner

*Primary Examiner* — Tha-o H Bui
(74) *Attorney, Agent, or Firm* — Richard T. Ogawa; Ogawa P.C.

(57) ABSTRACT

In an example, the present invention provides a computing system. The system has a memory interface device comprising a counter, a dynamic random access memory device coupled to the memory interface device. The device comprises a plurality of banks, each of the banks having a subarray, each subarray having a plurality of memory cells. The device has a data interface coupled to the plurality of banks. The device has an address interface coupled to the plurality of banks, and a particular pre-charge command configured to be transferred to the memory interface device. The counter is adapted to count a measured time duration from a first time when data are available at the data interface to a second time when a pre-charge command is received by the address interface.

12 Claims, 19 Drawing Sheets

| Rank ID | Bank ID | Row Address | Column Address | | Spare ID |
|---|---|---|---|---|---|
| 0 | 3 | 0x0A81 | 0x00C1 | | 0 |
| 0 | 3 | 0x1BC1 | 0x01E0 | | 1 |
| 1 | 0 | 0x0C03 | 0x032D | | 1 |
| 1 | 1 | 0x0047 | 0x0004 | | 0 |
| 1 | 1 | 0x0161 | 0x00CC | | 0 |
| 1 | 2 | 0x1958 | 0x006E | | 0 |
| 1 | 2 | 0x04DA | 0x01E9 | | 1 |
| 1 | 3 | 0x098C | 0x000E | | 1 |

FIG.13

HIDDEN REFRESH OF WEAK MEMORY STORAGE CELLS IN SEMICONDUCTOR MEMORY

CROSS-REFERENCE TO RELATED APPLICATIONS

This application claims priority to U.S. Provisional Patent Application No. 61/833,372, filed on Jun. 10, 2013 and also claims priority U.S. Provisional Patent Application No. 61/780,800, filed on Mar. 13, 2013, commonly assigned, and hereby incorporated by reference in their entirety herein for all purposes.

BACKGROUND OF INVENTION

The present invention relates to solid state memory storage systems and devices. More particularly, the present invention provides methods and devices for enabling but hiding longer write-recovery times for weak memory cells and repairing a "bad memory cell" with a substitute cell for a memory device such as a dynamic random access memory ("DRAM") device or others.

In solid state memory systems, a general class of memories includes low latency memories having effectively infinite endurance or usage-cycles and no degradation with respect to age or repeated accesses. Additional class of memories also includes relatively longer latency memories that do not have infinite endurance or usage cycles, and may degrade with respect to age or repeated accesses. In the case of the relatively long latency memories, sophisticated multi-error detection and correction algorithms have been implemented to correct for data cells that can degrade over the lifetime of memory devices due to aging effects or repeated accesses. In the case of low latency memories such as DRAM devices, however, effectively infinite endurance or usage-cycles are assumed so that once weak bits or bad bits are mapped out by device manufacturers, no errors should occur due to degradation of data cells due to aging effects or repeated accesses.

It is known that the conventional DRAM memory cell has an access transistor and a storage capacitor. The access transistor connects with the storage capacitor to a bitline when switched-on such that the capacitor stores the logic value placed on the bitline. Due to the tendency of a capacitor to lose its charge over time, DRAM memory cells must be periodically "refreshed", which serves to maintain the value stored in each storage capacitor at its desired value. The amount of time that a cell can retain its logic value is referred to as its "data retention time".

A trend in the development of memory cells is that the cell sizes have been shrinking due to advancements in process technology and the demand for ever larger memory capacity. This necessarily results in a reduction in the sizes of the access transistor and storage capacitor, which can lead to several limitations. For example, each access transistor exhibits leakage which acts to slowly drain stored charge from the storage capacitor. This leakage characteristic—and thus each cell's data retention time—varies from transistor to transistor; however, this variability increases as the size of the access transistors is reduced. Another problem is that a shrinking memory cell results in a smaller storage capacitor, and thus a reduced storage capacitance. This can also adversely affect the data retention time characteristics of the cells.

Moreover, the on-resistance (Ron) of the selection transistor may be higher-than-expected due to nature process variations, aging effects or repeated accesses. Consequently, a number of the memory storage cells may require longer-than-normal setting times such as longer tWR (Write Recovery) times. However, an increase in the cell storage (charging, or setting) times would decrease system performance. Consequently, techniques to hide the longer write recovery times are needed for weak memory cells.

Hence, it is highly desirable to develop a method of hiding longer write-recovery times for weak memory cells and repairing any "bad memory cell" with a substitute cell for a memory device.

SUMMARY OF THE INVENTION

The present invention is related to memory devices for electronic applications. More specifically, embodiments of the present invention provide memory interface devices and memory IC (integrated circuit) devices, which can be implemented various computing devices, servers, and the like. Merely by way of example, these devices can be configured for or implemented as memory devices, such as SDRAM, DDR SDRAM, RDRAM, SRAM, and Flash devices, and the like. In an example, a method is provided for the bad memory cells in memory devices to be repaired with substitute cells. Furthermore, a system and method are provided to enable longer write-recovery times for weak memory cells to attain charge or setting to full value. But it will be recognized that the invention as a much broader range of applicability.

In an example, the present invention provides a computing system. The system has a memory interface device comprising a counter, a dynamic random access memory (DRAM) device coupled to the memory interface device. The DRAM memory device comprises a plurality of banks. As shown in FIG. 1, each bank is arranged in a plurality of rows (e.g., 32 k rows). Further, each of the banks has a plurality of subarrays. Each subarray has a plurality of memory cells arranged in, for example, 512 rows. The DRAM memory device has a data interface provided as row-buffers respectively coupled to the plurality of banks. The DRAM memory device further has an address interface provided as row-decoders respectively coupled to the plurality of banks, and a particular pre-charge command configured to be transferred to the memory interface device. The counter is adapted to count measured time duration from a first time when data are available at the data interface to a second time when a pre-charge command is received by the address interface.

In an alternative example, the present invention provides method for operating a dynamic random access memory (DRAM) device to provide a concurrent active/pre-charge cycle for a weak DRAM cell and obtain a longer write recovery time transparent to a memory controller coupled to the DRAM device. The method includes receiving a write command to a first DRAM cell from the host controller. The first DRAM cell is provided in a bank, which is one of a plurality of banks in the DRAM device. The bank comprises a plurality of subarrays. The method includes receiving data associated with the write command from the host controller to the first DRAM cell to store the data into a first cell capacitor of the first DRAM cell at a first voltage level and initiating a counter to count a measured time duration from a first time when the data is available at an the data interface of the DRAM device to a second time when a pre-charge command is received by an address interface of the DRAM device. The method includes comparing the measured time with a predetermined time from the first time and storing a first address in a row address register for the first DRAM cell. The method includes receiving an activate command for a second DRAM cell associated with the bank comprising the plurality of subarrays. The second DRAM cell comprises a second address. The method includes determining whether the first address and the second address are associated with a particular subarray in the bank; and if the first address and the second address are not associated with the particular subarray in the bank, initiating an activation process associated with the activate command for the first DRAM cell.

The longer write-recovery time relies on the observation that the physical implementation of modern DRAM devices segment individual DRAM banks into tiles (subarrays) where each tile has its own set of local row-buffer (set of sense amplifiers). The techniques described herein relies on the observation that activation-precharge cycles may proceed independently, and take advantage of the concurrent activation-precharge cycles to refresh or recharge the analog DRAM cells to full digital value.

In a specific embodiment, the present invention also provides a memory interface device. The memory interface device includes an address input(s) configured to receive address information from an address stream of a host controller and an address output(s) configured to drive address information. The address output(s) is coupled to a plurality of memory devices and the plurality of memory devices is configured in a stacked with the memory interface device. The memory interface device further includes an address match table comprising at least a revised address corresponding to a spare memory location and a control module configured to determine address information from an address stream from an address command bus coupled to a host controller during a run time operation. The control module is configured to compare each address from the address stream and configured to determine whether each address matches with a stored address in the address match table to identify a bad address and configured to replace the bad address with the revised address of the spare memory location. Additionally, the memory interface device includes a multiplexer coupled to the address input and coupled to the address output. Furthermore, the memory interface device includes a self-monitoring module coupled to the control module. Moreover, the memory interface device includes a vertical error correction coupled to each of the plurality of memory devices.

In an alternative embodiment, the present invention provides a system and method for replacing faulty or weak memory storage cells in a memory system through the use of an enhanced memory interface circuit or an enhanced memory controller device and the use of redundant memory storage cells. Specifically, an embodiment of the present invention provides a plurality of DRAM devices with each of the DRAM devices being coupled to a separate bad cell repair module. More specifically, embodiments of the present invention provide memory interface devices and memory IC (integrated circuit) devices, which can be implemented in various computing devices, servers, and the like. Merely by way of example, these devices can be configured for or implemented as memory devices, such as SDRAM, DDR SDRAM, RDRAM, SRAM, and Flash devices, and the like. But it will be recognized that the invention as a much broader range of applicability.

These and other features, aspects, and advantages of the present invention will become better understood with reference to the following description and claims.

BRIEF DESCRIPTION OF THE DRAWINGS

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings in which:

FIG. 13 illustrates a simplified Address Match Table according to an embodiment of the present invention.

DETAILED DESCRIPTION OF SPECIFIC EMBODIMENTS OF THE INVENTION

The present invention provides for a method that may be implemented in different ways for different systems and memory devices. Five different implementations are described herein as illustrative examples; the examples should not be construed as limiting the present invention in nature. In all implementation of the present invention, it is assumed that the DRAM device implements the DRAM banks in the form of tiles where the tiles have independent sets of sense amplifiers, and the tiles may be modified so that two or more tiles in a given bank can concurrently execute activation-precharge commands.

Implementation A: DRAM-Only Implementation of the Present Invention

Figure 1:
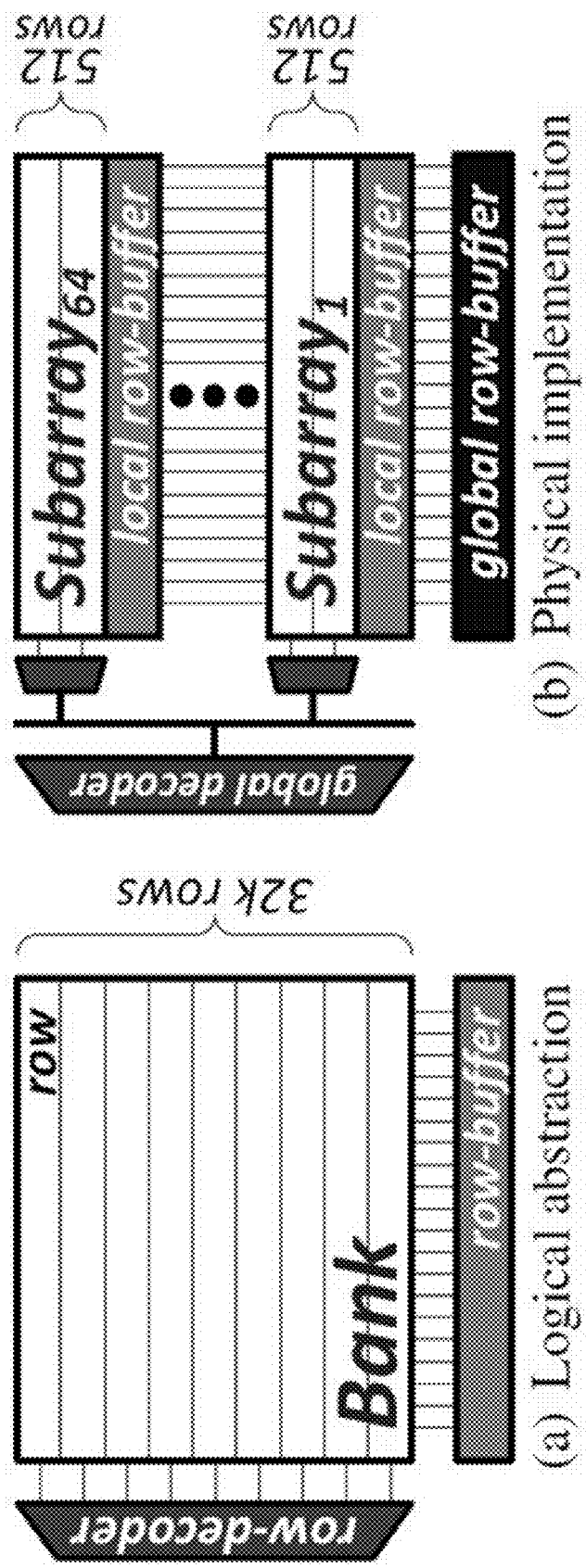
FIG. 1 is a DRAM bank organization according to an example of the present invention.

FIG. 1 is a DRAM bank organization according to an example of the present invention. As shown in part a), a DRAM bank logically is arranged in many rows, e.g., 32 k rows, coupled to a row-decoder and a data buffer. In part b), the DRAM bank is physically implemented as many rows of subarrays. Each subarray is associated with a local row buffer and coupled to a global address decoder. For example, each subarray contains 512 rows of memory cells. The bank is coupled to a global data buffer connected to each local row buffer.

Figure 1A:
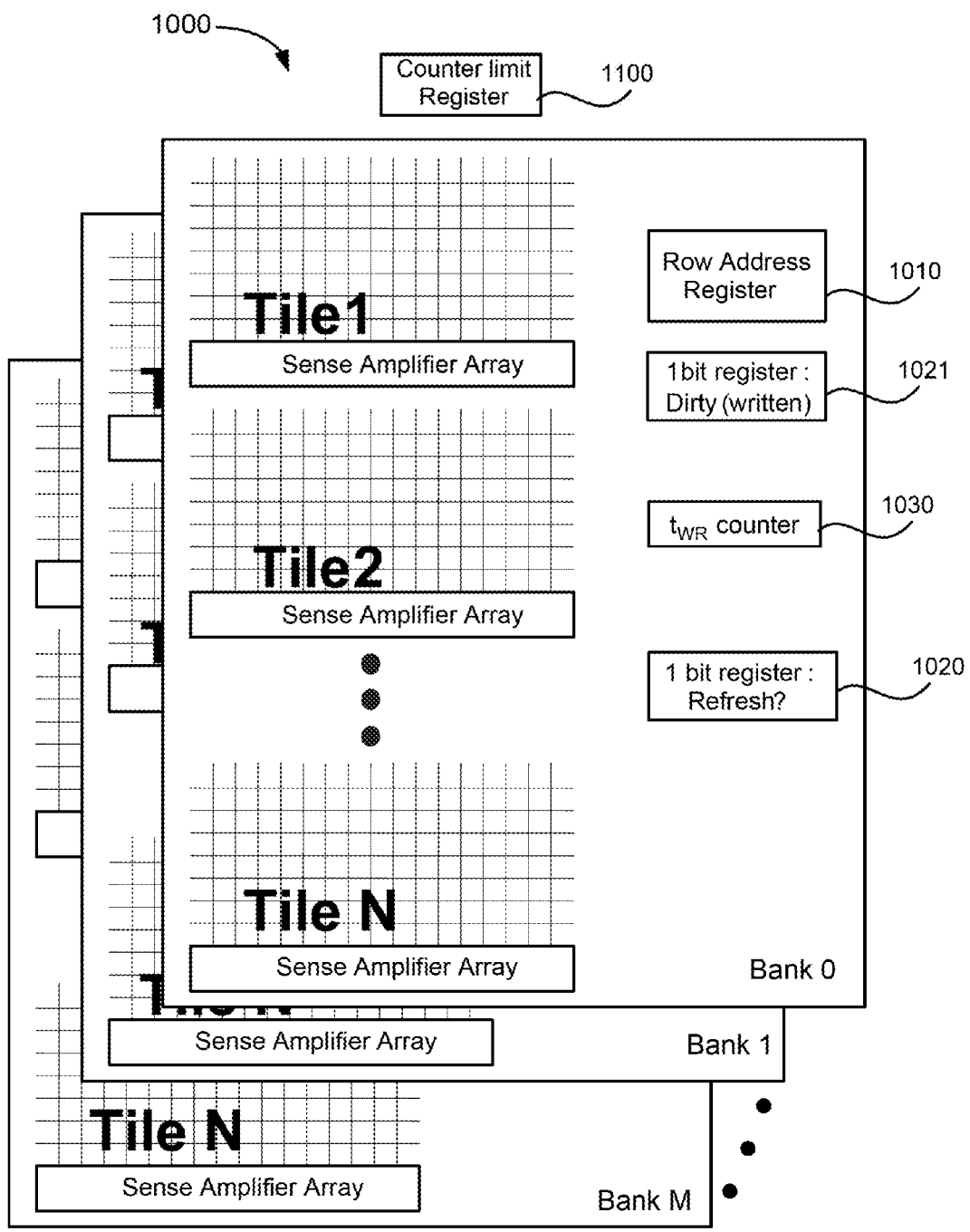
FIG. 1A is a simplified block diagram of circuit elements in DRAM Device for Implementation A according to an example of the present invention.

According to an embodiment of the present invention, hereafter referred to as Implementation A, FIG. 1A is a simplified block diagram of circuit elements in the DRAM device 1000 referred in the FIG. 1. As shown in FIG. 1A, each DRAM bank has a row address register 1010, a Write-recovery time counter 1030, a counter limit register 1100, and a 1-bit status register 1020 to indicate whether the row-address register contains the address of or row (in 1021) that needs to have its data refreshed and further indicates more write recovery needed. In a specific embodiment, each DRAM bank may include one dirty (written) register 1021. The counter limit register 1100 is programmed by the DRAM manufacturer at a value that guarantees that the weak cell can be charged to full value. FIG. 1A shows the block diagram of implementation A where there are N numbers of Tiles (subarrays) of DRAM cells in a given bank (e.g., Bank 0), and there are M numbers of banks in the DRAM device 1000.

Figure 2:
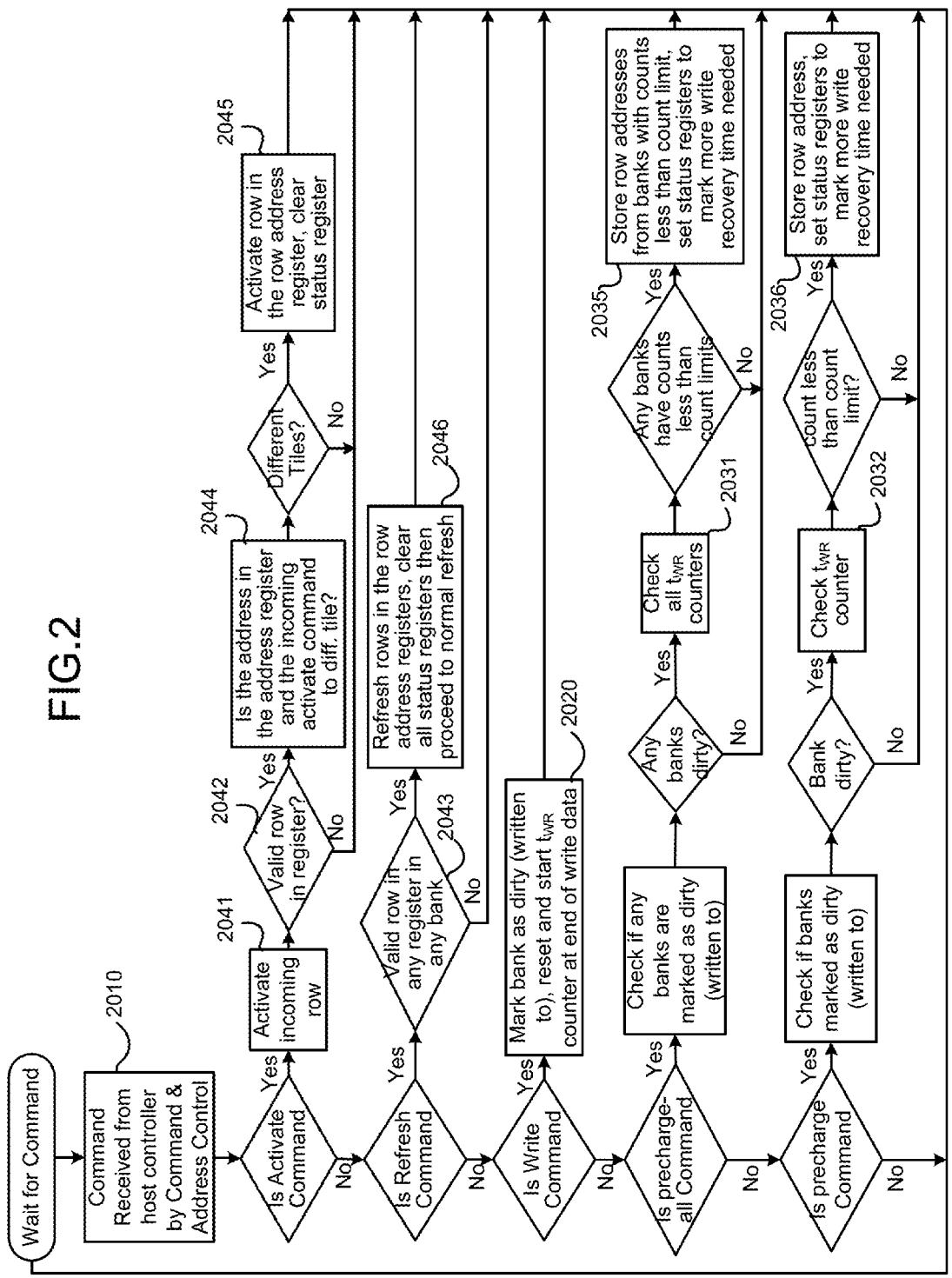
FIG. 2 is a simplified control flow diagram for DRAM Device of Implementation A according to an example of the present invention.

FIG. 2 is a simplified control flow diagram for DRAM Device of Implementation A according to an example of the present invention. As shown in the Implementation A, each time a write command is received by a given bank in a DRAM device (device 1000 of FIG. 1A), the Write-recovery time counter associated with the targeted bank begins to count as soon as the host memory controller stops driving write data into the DRAM device (see 2010). In the case that a read command follows a write command to the same bank, the Write-recovery time counter is reset, and the counting is stopped (see 2020). Alternatively, in the case that another write command to the same bank is received by the DRAM device, the Write-recovery time counter is reset to zero, and begins to count again as soon as the host memory controller stops driving write data into the DRAM device. Finally, in the case that a precharge command is received by the DRAM device, the Write-recovery time counter is stopped and the count value is compared to the value contained in the counter limit register (see, 2031 and 2032). If the value in the write-recovery time counter is less than the value contained in the counter limit register, the 1-bit status register is set, and the row address is saved in the row address register (see, 2035 and 2036).

Thereafter, in the case that an activation command is received by a given bank in a DRAM device, the DRAM bank initiates the activation command (2041) and checks in the 1-bit status register (1020 of FIG. 1A) to see if the row address register holds a valid row address that needs to be refreshed (2042 or 2043). If the row address register holds a valid row address and the row address is directed to a different tile as the current activation command (2044), a separate activation command to the row address held in the row address register is initiated (2045), then the 1-bit status register is then cleared (2045, or 2046). Thereafter, when a precharge command is received by the DRAM device to precharge the targeted bank, both active tiles are precharged. In this manner, the row which previously did not have sufficiently long write recovery time can now have $t_{RAS}$ time to completely recharge the weak cell or cells. The $t_{RAS}$ is a time period between when a DRAM row is activated and when the values of the cells in row are restored into the DRAM cells.

One drawback of implementation A of the present invention is that in the case that the incoming activation command is directed to the same tiled array as the row address in the row address register, the refreshing activation-precharge cycle cannot proceed concurrently with the incoming activation command. Moreover, a subsequent write command to the newly opened row may itself require additional write-recovery time, and the probabilistic tile collision between successive row activations to the same bank may force a row with a real weak bit to be dropped and not given the additional refreshing activation-precharge cycle while a row that does not need the additional write recovery time gets the refreshing activation-precharge cycle. Consequently, an improved scheme may be devised to further reduce the probability that a weak bit misses the refreshing activation-precharge cycle.

Implementation B: Improved DRAM-Only Implementation

Figure 3:
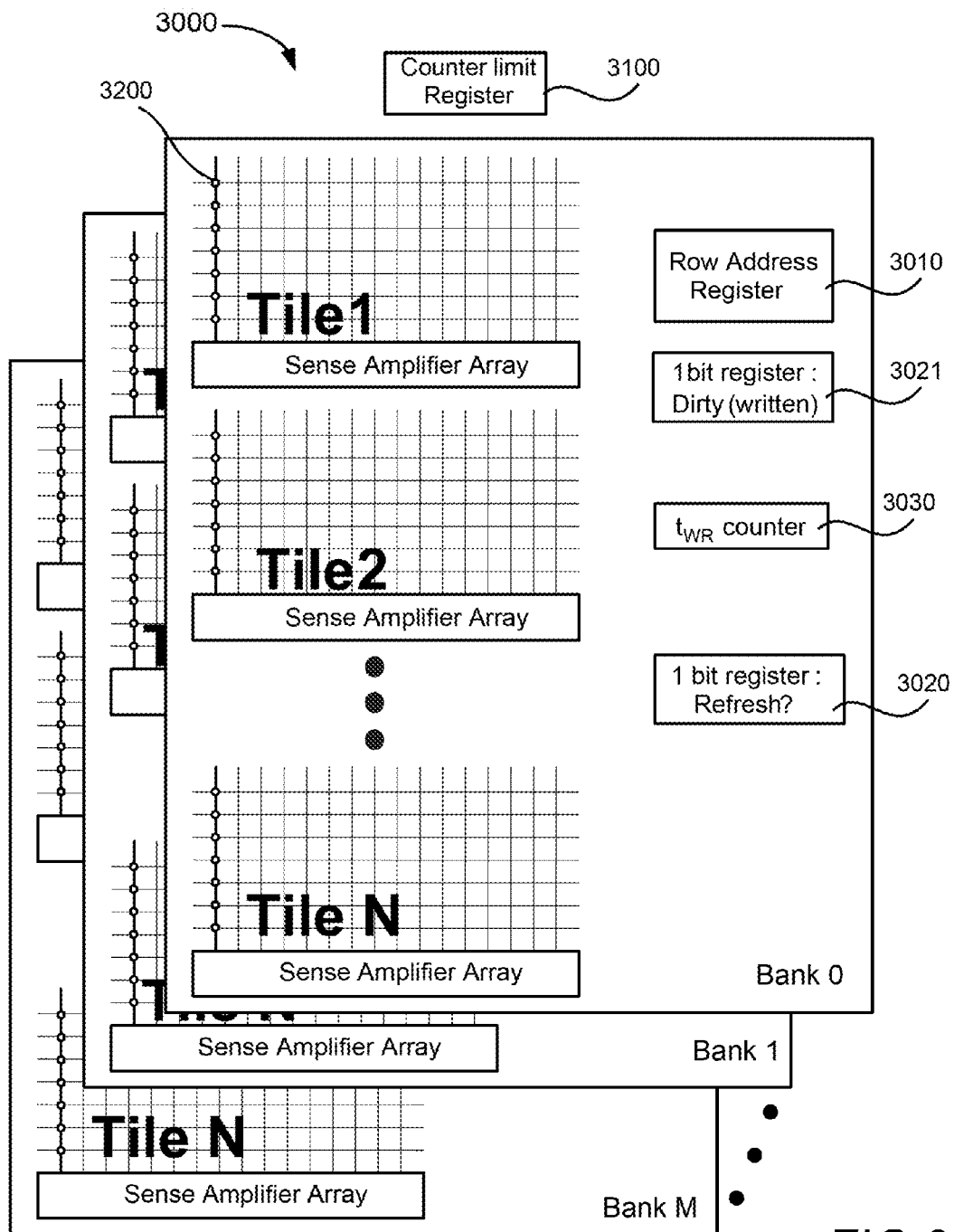
FIG. 3 is a simplified block diagram of circuit elements in DRAM Device for Implementation B according to an example of the present invention.

FIG. 3 shows a simplified block diagram of circuit elements in a DRAM device 3000 according to a different implementation of the present invention, hereafter referred to as Implementation B. As shown, each DRAM bank has a row address register 3010, a Write-recovery time counter 3030, a counter limit register 3100, and a 1-bit status register 3020 to indicate whether the row-address register contains the address of a row (in 3021) that needs to have its data refreshed and further indicates more write recovery needed. In a specific embodiment, each DRAM bank may include one dirty (written) register 3021. The counter limit register 3100 is programmed by the DRAM manufacturer at a value that guarantees that the weak cell can be charged to full value. In addition to the structures defined and utilized in Implementation A, each row or blocks of rows in Implementation B contains an additional 1-bit fuse element 3200 that may be set to indicate the presence of a weak bit in a row that requires the longer write recovery time.

In implementation B, each DRAM cell is tested for the write recovery time. In the case that a row or block of rows contains one or more cells that does not meet the standard $t_{WR}$ write recovery time but does met a longer, relaxed write recovery time as programmed in the counter limit register 3100, the 1-bit fuse element 3200 associated with the row or block of rows is set to indicate the presence of a weak bit in the row or block of rows.

Figure 4:
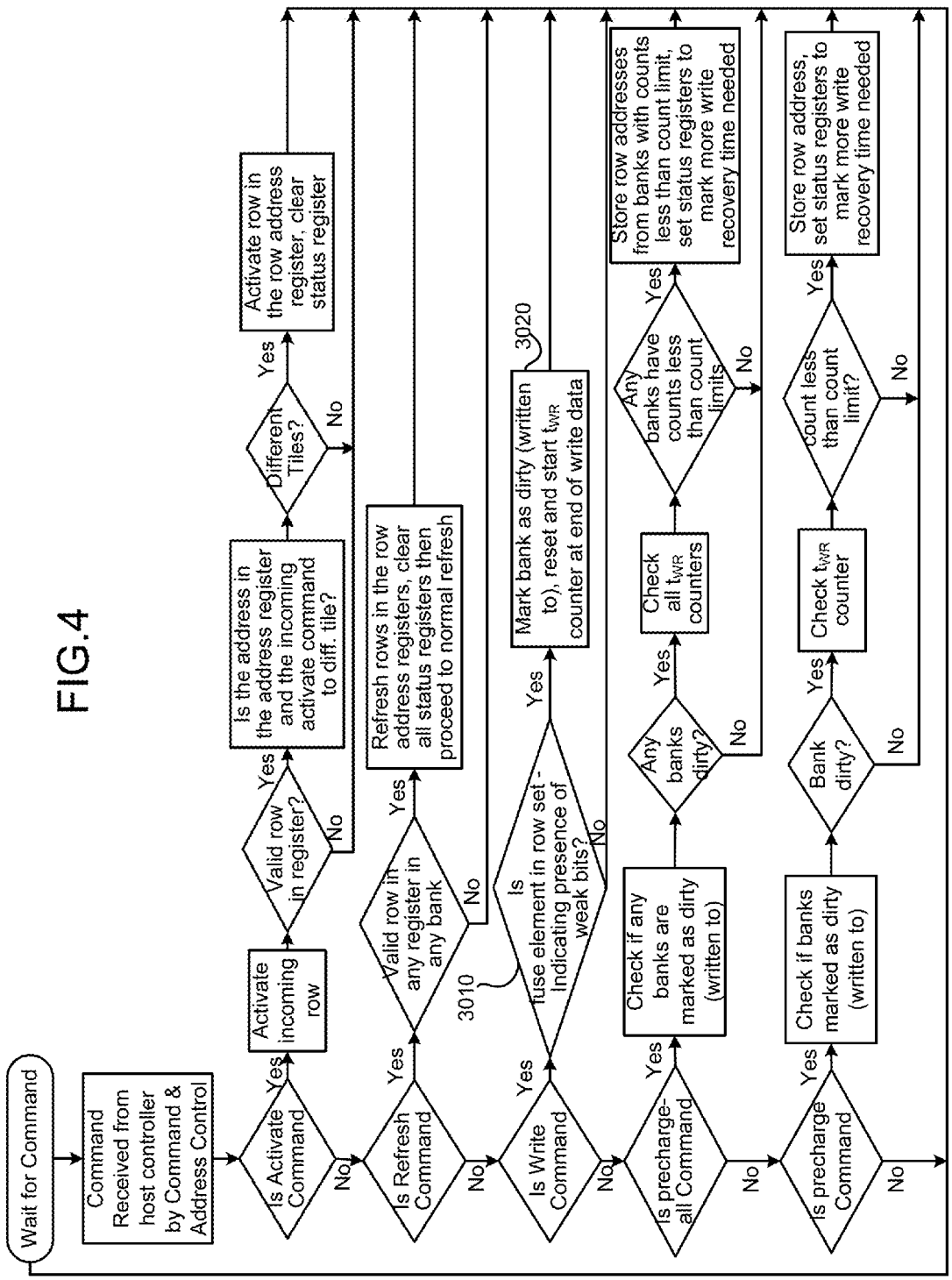
FIG. 4 is a simplified control flow diagram of DRAM device of Implementation B according to an example of the present invention.

FIG. 4 is a simplified control flow diagram of DRAM device of Implementation B according to an example of the present invention. In Implementation B, each time a write command is received by a given bank in a DRAM device, the Write-recovery time counter associated with the targeted bank operates as specified in Implementation A. The difference between Implementation A and Implementation B is that in Implementation B, the 1-bit status register is set and the row address is saved in the row address register (3020) if and only if the 1-bit fuse element associated with the row or block of rows indicate the presence of a weak bit (3010).

The drawback of Implementation B is similar to Implementation A is that in the case that the incoming activation command is directed to the same tiled array as the row address in the row address register, the refreshing activation-precharge cycle cannot proceed concurrently with the incoming activation command, and the probabilistic tile collision between successive row activations to the same bank may force an additional refreshing activation-precharge cycle to a row that needs it to be dropped. However, the advantage of Implementation B is that only rows with weak bits will be scheduled for added write recovery time, and the chance of a probabilistic collision between two successive row activations to rows with weak bits would be far smaller than two successive row activations to any row of a given bank. Implementation B thus reduces the probability that a weak bit will fail its data retention requirement due to insufficient write recovery time.

Implementation C: Basic RCD and DRAM Implementation

Figure 5:
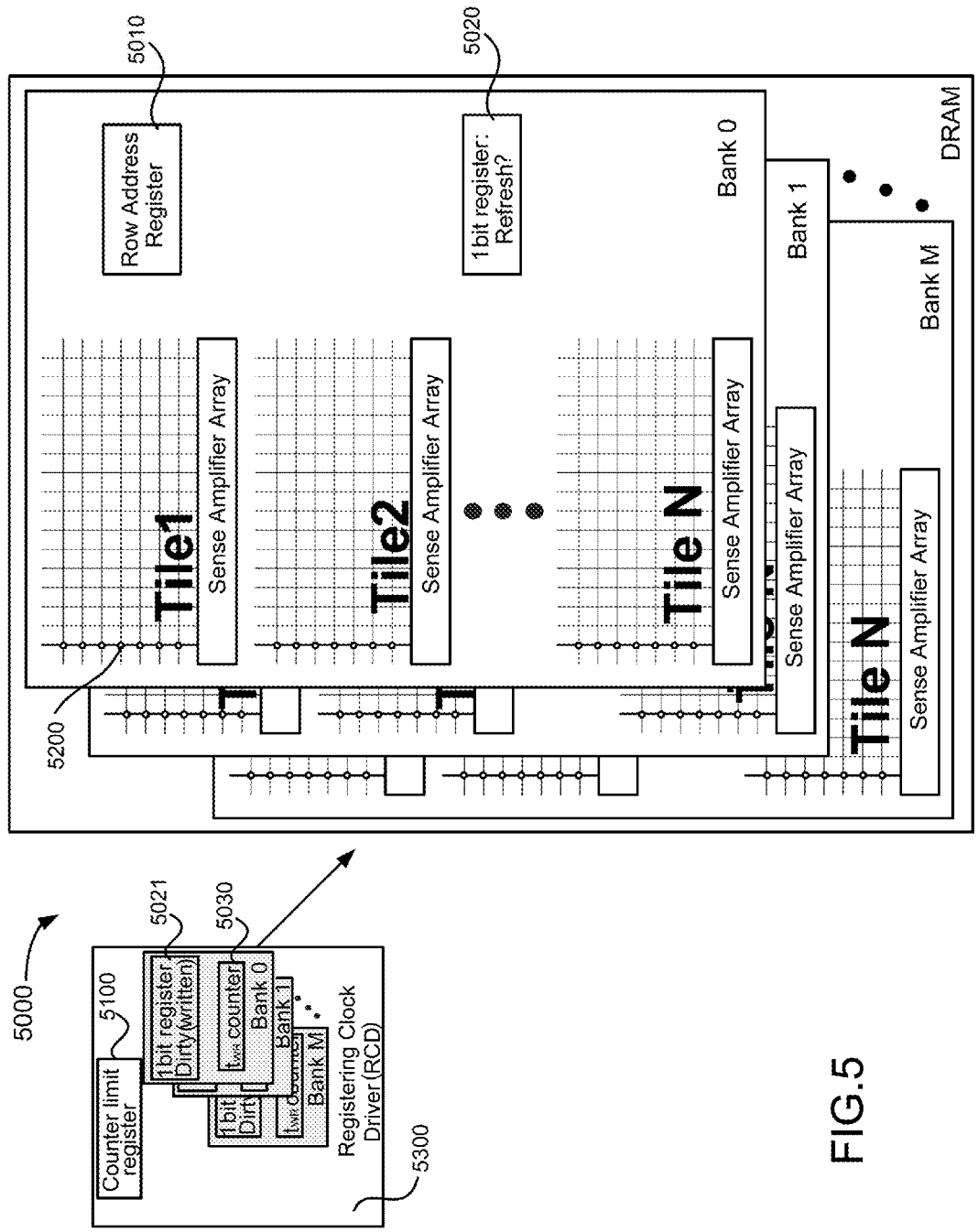
FIG. 5 is a simplified block diagram of circuit elements in registering clock driver and DRAM Device for implementation C according to an example of the present invention.

FIG. 5 is a simplified block diagram of circuit elements in registering clock driver and DRAM device 5000 according to an example of the present invention, hereafter referred to as Implementation C. As shown, the per-bank Write-recovery time counter 5030, and the per-bank counter limit register 5100 are moved from banks of DRAM devices into a RCD (Registering Clock Driver) 5300. The RCD is configured to control multiple DRAM devices (Bank 0 through Bank M). Whereas the per-bank 1-bit status register 5020 to indicate whether the row-address register contains the address of a row (in 5021) that needs to have its data refreshed, and the per-bank register 5010 that save the row address remain as part of the DRAM device 5000.

In Implementation C, the DRAM device contains a 1-bit fuse element 5200 for every row that may be set to indicate the presence of a weak bit that requires the longer write recovery time just as in Implementation B, and the DRAM cells are tested and fuse elements are set in Implementation C just as they are in Implementation B.

Figure 6:
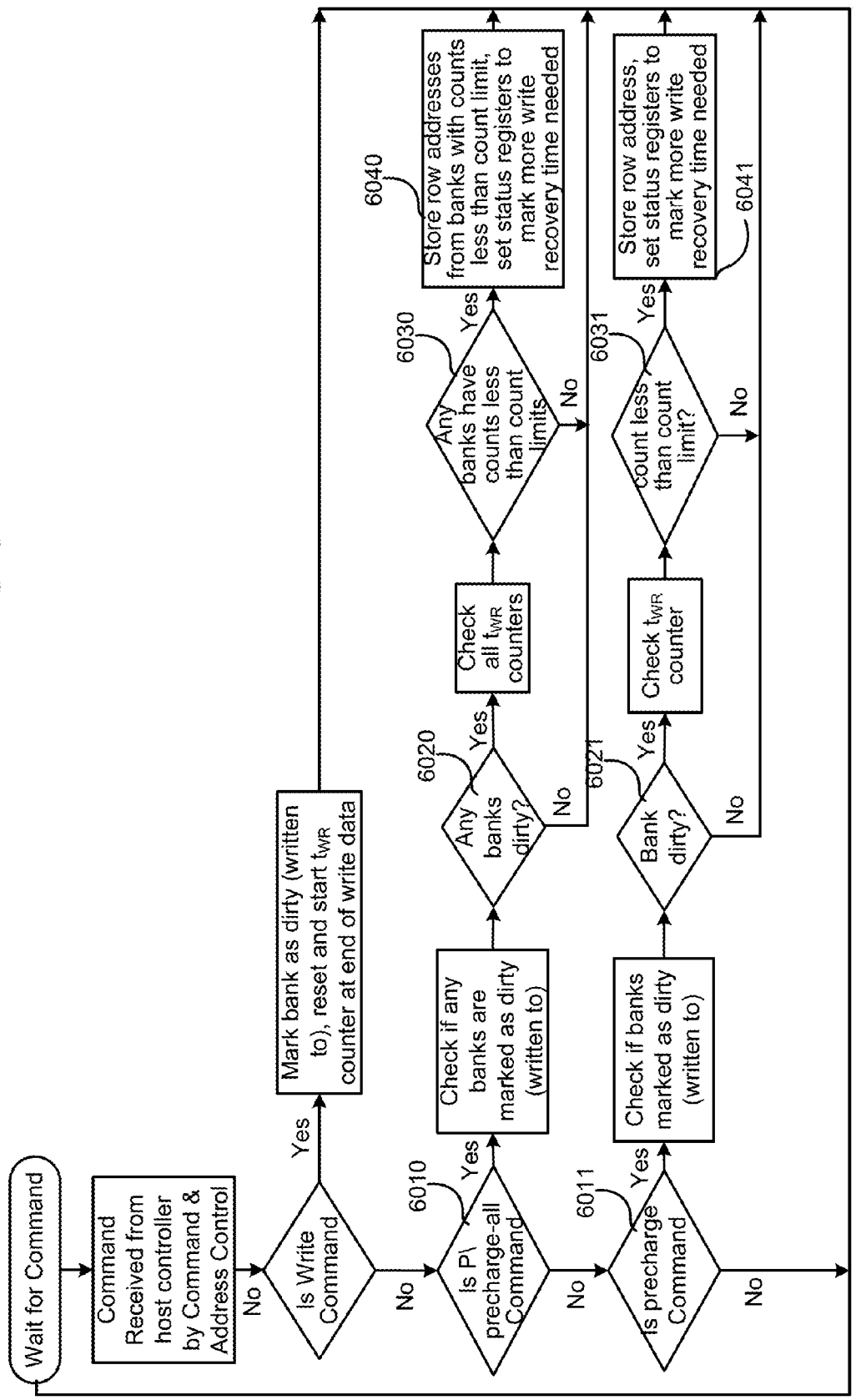
FIG. 6 is a simplified flow diagram for registering clock driver of implementation C according to an example of the present invention.

In Implementation C, the observation and counting of the timing between the write command the precharge command is performed by the RCD 5300. FIG. 6 is a simplified flow diagram for registering clock driver of implementation C according to an example of the present invention. In the case that a precharge command is received (see 6010 or 6011 of FIG. 6) by the RCD 5300 where any dirty (written) register may be included in each bank (see 6020 or 6021), the per-bank Write-recovery time counter 5030 is stopped and the count value is compared (see 6030 or 6031) to the value contained in the counter limit register 5100. If the value in the write-recovery time counter 5030 is less than the value contained in the counter limit register 5100, the RCD 5300 sends a modified precharge command (with a specially defined address bit, such as specially defined A13 or A17) to indicate that the needed write recovery time was not met (see 6040 or 6041 of FIG. 6).

In Implementation C, the DRAM device checks the status of the fuse element 5200 to determine whether or not the row contains a weak bit that needs the longer write recovery time, and in the case that the modified precharge command indicates that the write recovery time is insufficient, the DRAM device 5000 then saves the row address and sets the 1-bit status register to indicate that the row needs additional write recovery time.

Implementation C improves upon Implementation B by moving the counters 5030 from the DRAM devices into the RCD 5300. Since RCD 5300 typically supports 9 or 18 DRAM devices per rank, moving counters from the DRAM device into the RCD 5300 attains a 9-fold or 18-fold improvement in efficiency.

Implementation D: Alternate RCD and DRAM Implementation

In an alternative implementation of the present invention, hereafter referred to as Implementation D, the per-bank write-recovery time counter, and the per-bank counter limit register are moved into the RCD (Registering Clock Driver) the same as in Implementation C. The per-bank 1-bit status register to indicate whether the row-address register contains the address of a row that needs to have its data refreshed, and the per-bank register that save the row address remain as part of the DRAM device also as in Implementation C.

In Implementation D, the DRAM device does not contain fuse elements to indicate the presence of a weak bit that requires the longer write recovery time. Instead, the RCD contains an address match table (AMT) that tracks the row addresses of rows that have a weak bit that require long write recovery time.

Figure 7:
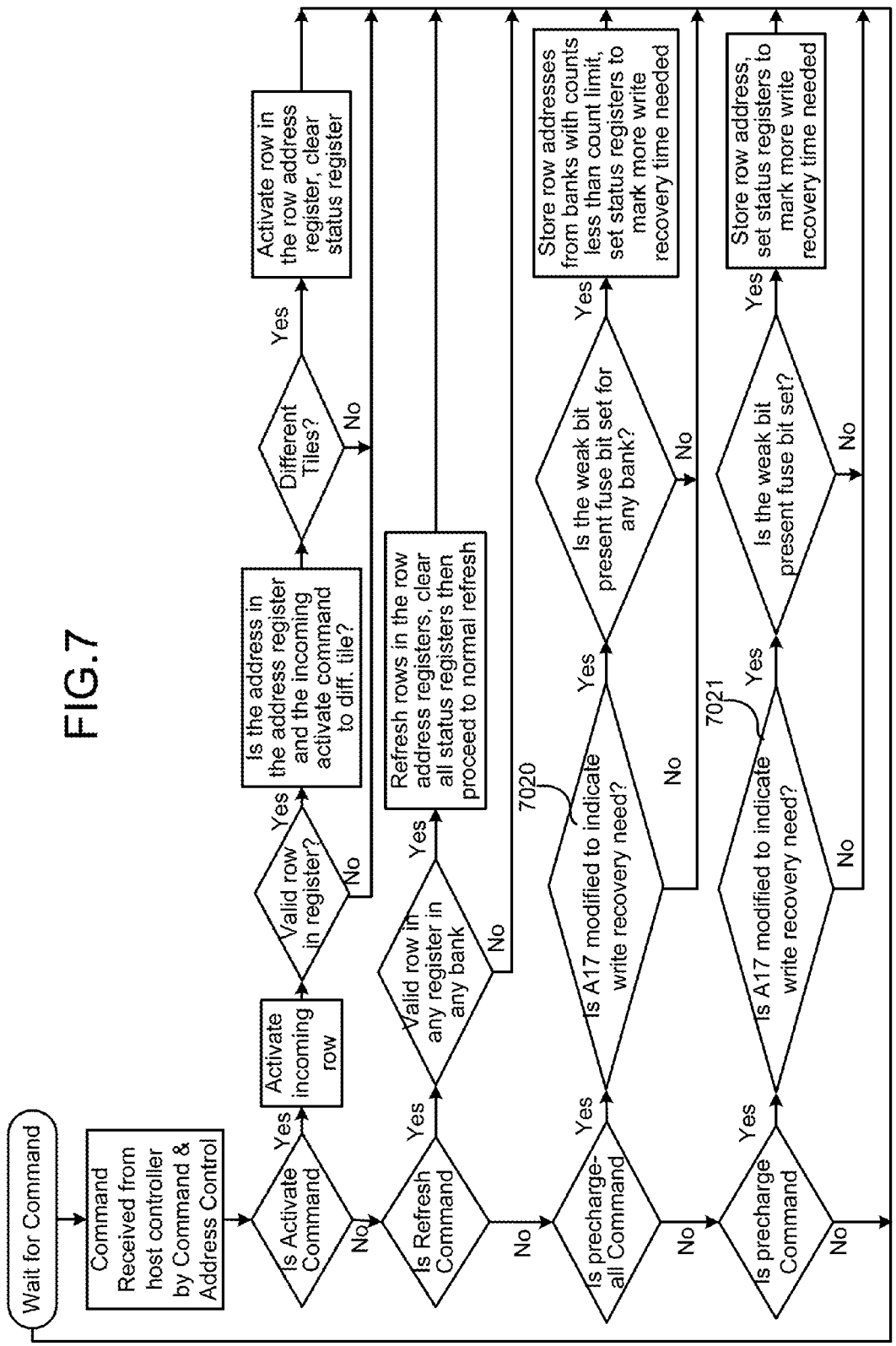
FIG. 7 is a simplified control flow diagram for DRAM Device of Implementation D according to an example of the present invention.

In Implementation D, the observation and counting of the timing between the write command the precharge command is performed by the RCD. FIG. 7 is a simplified control flow diagram for DRAM Device of Implementation D according to an example of the present invention. In the case that a precharge command is received by the RCD, the per-bank Write-recovery time counter is stopped and the count value is compared to the value contained in the counter limit register. If the value in the write-recovery time counter is less than the value contained in the counter limit register and the row address of the currently active bank is found in the address match table AMT, the RCD sends a modified precharge command (specially defined A13 or A17 bit) to indicate that the needed write recovery time was not met (see 7020 or 7021), and the row needs the additional write recovery time.

In Implementation D, the DRAM device then saves the row address and sets the 1-bit status register to indicate that the row needs additional write recovery time in the case that the modified precharge command is received.

Implementation D simplifies DRAM implementation by removing the per-row fuse element from the DRAM device, and instead, moves the responsibility of tracking the row addresses into the AMT data structure in the RCD. The AMT data structure contains a weak bit address list that contains the addresses of rows with weak bits, and the weak bit address list is programmed into the RCD after the DRAM devices and the RCD are assembled onto a memory module.

Implementation E: RCD-Heavy and DRAM Implementation

Figure 8:
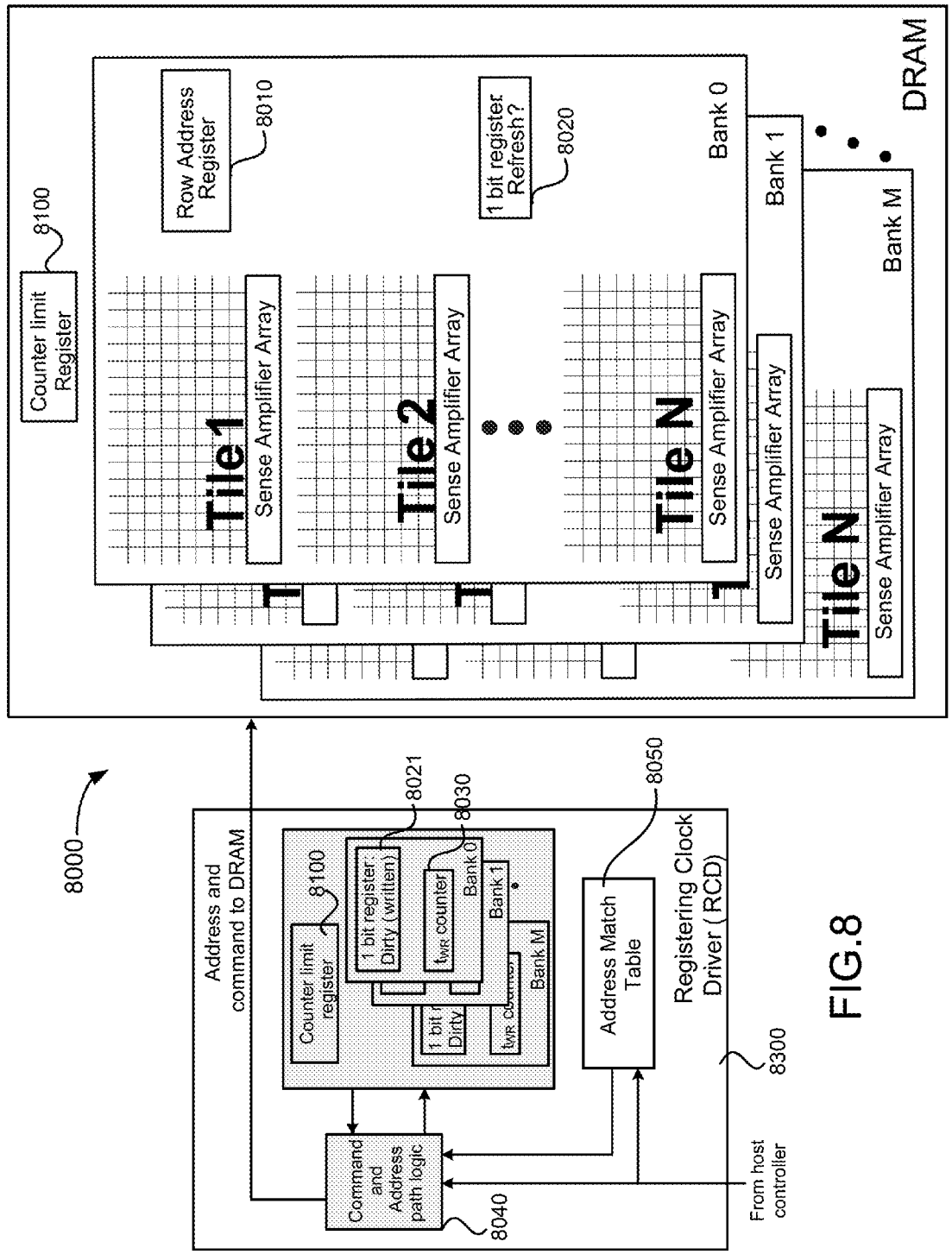
FIG. 8 is a simplified block diagram of circuit elements in registering clock driver and DRAM device for implementation E according to an example of the present invention.

FIG. 8 is a simplified block diagram of circuit elements in registering clock driver (RCD) and DRAM device according to an example of the present invention, hereafter referred to as Implementation E. As shown, the per-bank Write-recovery time counter 8030, and the per-bank counter limit register 8100 are moved from banks of DRAM devices into a RCD (Registering Clock Driver) 8300. The RCD 8300 is configured to control multiple DRAM devices (Bank 0 through Bank M). Whereas the per-bank 1-bit status register 8020 to indicate whether the row-address register contains the address of a row that needs to have its data refreshed, and the per-bank register 8010 that save the row address remain as part of the DRAM device 8000. The DRAM implementation functionality is substantially the same as in Implementation D. The RCD 8300 contains an address match table (AMT) 8050 that tracks the row addresses of rows that have a weak bit (in 8021) that require long write recovery time. The AMT data structure contains a weak bit address list that contains the addresses of rows with weak bits, and the weak bit address list is programmed into the RCD after the DRAM devices and the RCD are assembled onto a memory module.

Figure 9:
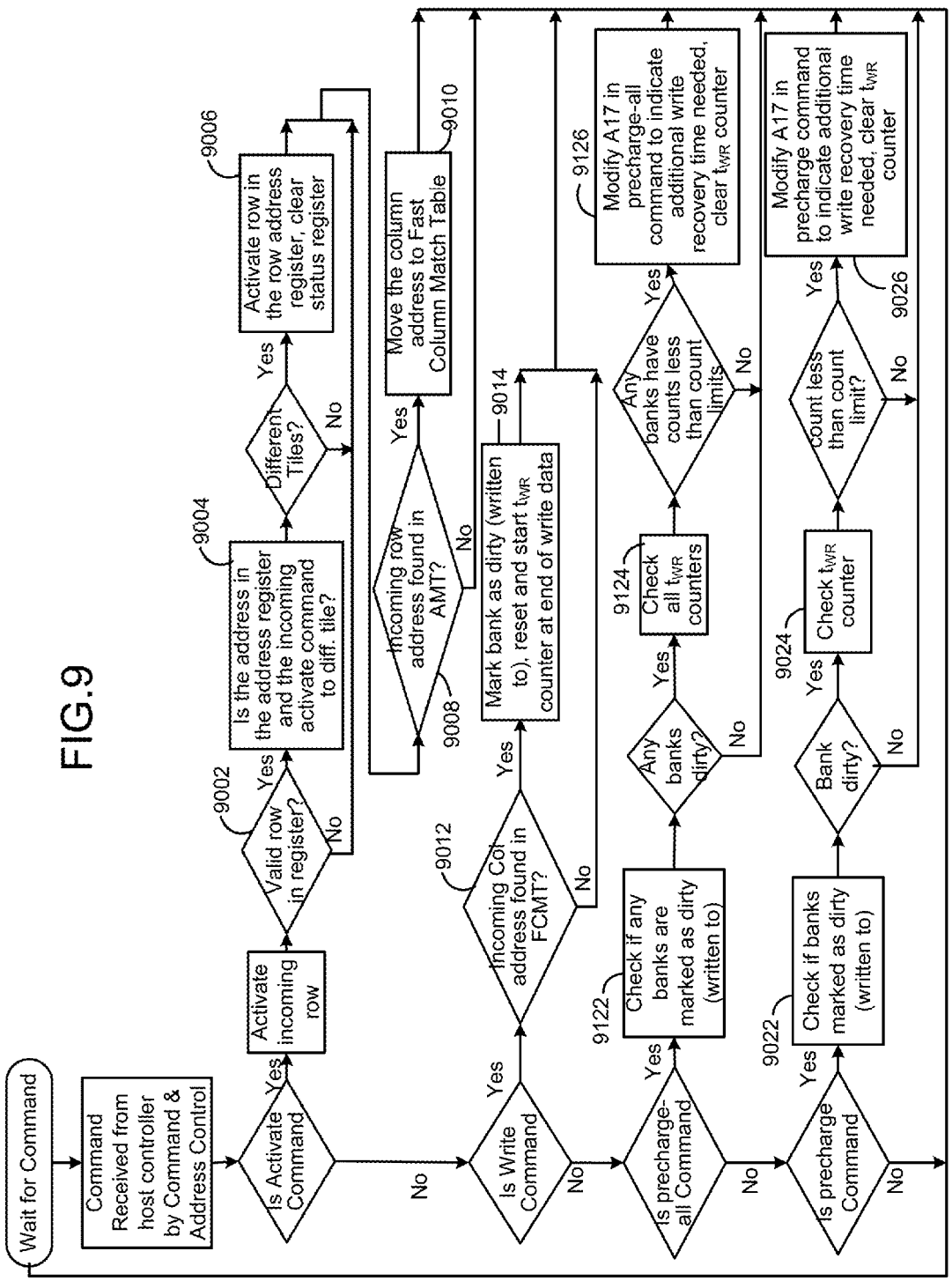
FIG. 9 is a simplified control flow diagram for registering clock driver of implementation E according to an example of the present invention.

FIG. 9 is a simplified control flow diagram for registering clock driver RCD of implementation E according to an example of the present invention. In an embodiment, FIG. 9 shows the operation of the enhanced RCD and DRAM devices in receiving commands from the host controller and acting on the input commands. In another embodiment, FIG. 9 illustrates the operation of the RCD to affect the refresh process of DRAM cells that require additional write recovery time in DRAM device that supports the additional encoded signal to enable the refresh of DRAM cells.

In the case that the command received by the RCD is an activate command, the enhanced DRAM device checks to see if the row activation to the targeted bank has an outstanding row activation that requires additional refresh (valid row in register) (see 9002 of FIG. 9). In the case (9004) there is a valid row in the register and the row address of the incoming row activation command and the row address of the valid row in the register are mapped to different tiles in the DRAM device, then the DRAM device clears the stored entry in the row address register and activates both the incoming row as well as the row whose address was stored in the row address register (see 9006 of FIG. 9). In parallel, the RCD searches in the Address Match Table (AMT) for a match to the row address of the incoming row activation command (see 9008 of FIG. 9). In the case that a match is found, the column address (or column addresses in the case there are multiple column addresses associated with the target row) is moved into the Fast Column Match Table (FCMT) pending the arrival of a subsequent column write command to the activated row (see 9010 of FIG. 9).

FIG. 9 also shows that in the case that the command received by the RCD is a column write command, the RCD checks the column address of the column write command against the column address or addresses in the FCMT (see 9012 of FIG. 9). In the case there is a hit (9014), the bank is marked as dirty, and the $t_{WR}$ counter is started to count the number of cycles that elapsed before the arrival of the pre-charge or precharge-all command.

FIG. 9 also shows that in the case that the command received by the RCD is a precharge command, the RCD checks to see if the bank had been marked as dirty, indicating a column that needed the additional write recovery time had been written to (see 9022 of FIG. 9). In the case that the bank had been marked dirty, the RCD further checks the value in the $t_{WR}$ counter against the value in the counter limit register (9024). In the case that the value in the $t_{WR}$ counter is larger than the counter limit register, no additional write recovery time is needed. However, in the case that the value in the tWR counter is smaller than the counter limit register, additional write recovery time is needed and the RCD modifies the precharge command using, for example, the A17 signal to indicate to the DRAM device that the current row needs additional write recovery time, and that the row address needs to be stored in the row address register (see 9026 of FIG. 9).

Finally, FIG. 9 also shows that in the case that the command received by the RCD is a precharge-all command, the RCD checks to see if any open banks had been marked as dirty (see 9122 of FIG. 9), indicating a column that needed the additional write recovery time had been written to. Then, for all banks had been marked dirty, the RCD further checks the value in the $t_{WR}$ counters against the value in the counter limit register (see 9124 of FIG. 9). In the case that the values in all $t_{WR}$ counters are larger than the counter limit register, no additional write recovery time is needed. However, in the case that the value in any $t_{WR}$ counter is smaller than the counter limit register, additional write recovery time is needed and the RCD modifies the precharge-all command using, for example, the A17 signal to indicate to the DRAM device that all current rows need additional write recovery time, and that the row addresses needs to be stored in the row address register (see 9126 of FIG. 9).

Figure 10:
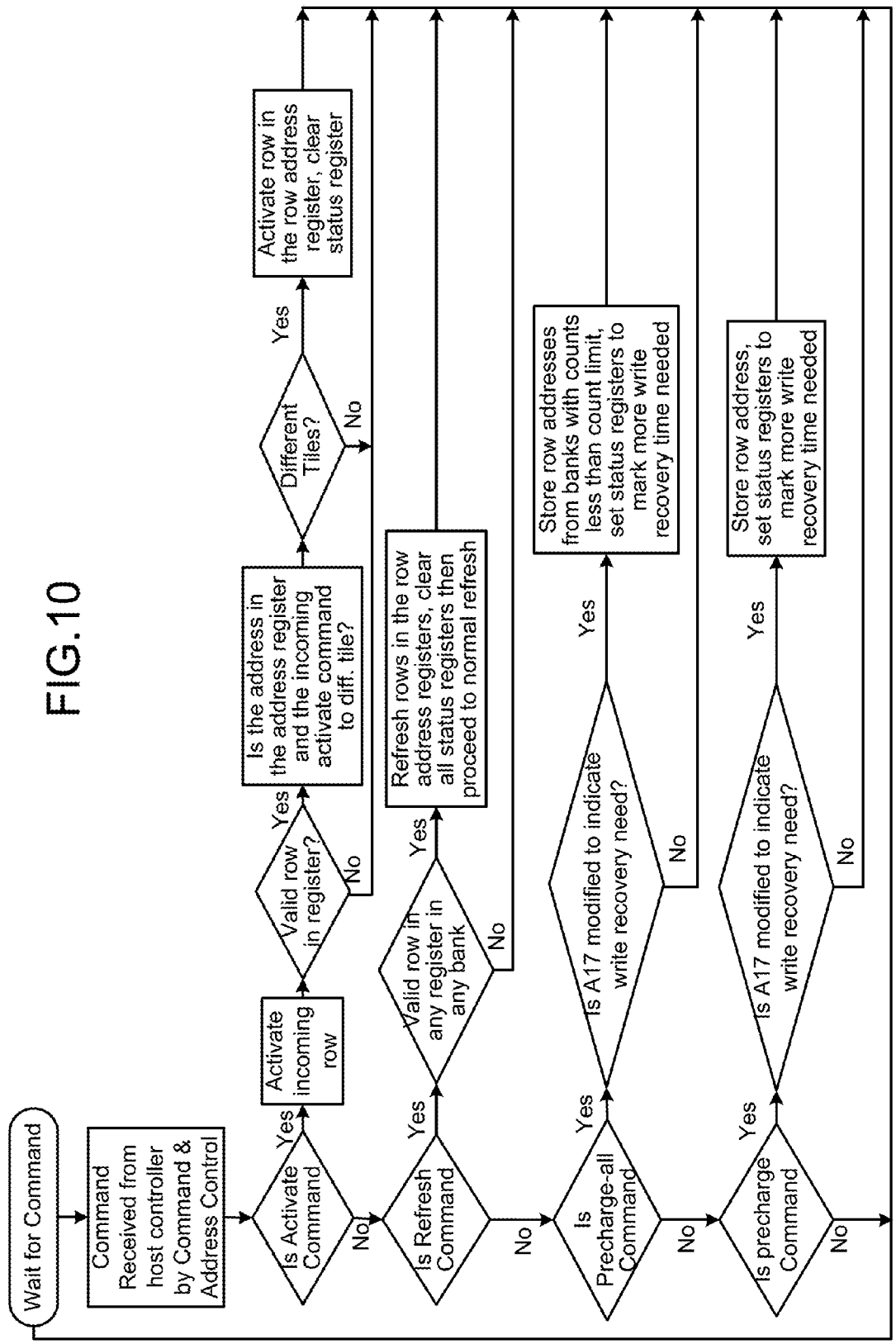
FIG. 10 is a simplified control flow diagram for DRAM device of implementation E according to an example of the present invention.

FIG. 10 is a simplified control flow diagram for DRAM device of implementation E with a RCD according to an example of the present invention. This diagram is merely an example, which should not unduly limit the claims herein. One skilled in the art would recognize other variations, modifications, and alternatives. As shown, the operation of a simplified RCD (e.g., 8000 in FIG. 8) is illustrated where the RCD does not track or compare the time between write command and precharge command to determine if is sufficient, nor are the column-addresses compared to see if the writes are to specific weak column address locations. Rather, the RCD makes the simplifying assumption that all writes to weak rows require additional refresh time, and any time a column write command is sent to a row with weak cells, the RCD indicates to the DRAM device that additional write recovery time is needed.

The difference between Implementation E and Implementation D is that in Implementation E, the address match table (AMT) 8050 is further enhanced by tracking both the row address as well as the column address of weak bits in each bank. This is processed through a Command and Address logic path 8040 to generate a modified precharge command (specially defined A13 or A17 bit). In Implementation E, the modified precharge command to send the bit to indicate the currently-accessed row needs to additional write-recovery time is sent if and only if the RCD (8000) determines that the specifically located weak bit location (in 8021) was written to and that insufficient write recovery time was provided to the weak bit.

In a specific embodiment, Implementation E improves upon Implementation D by specifically targeting the cases where additional write recovery times are really needed, thus minimizes the possibility that a needed activation-precharge cycle to a row with weak cells is dropped.

Utilizing an Address Match Table in Memory Interface Circuit

Figure 11:
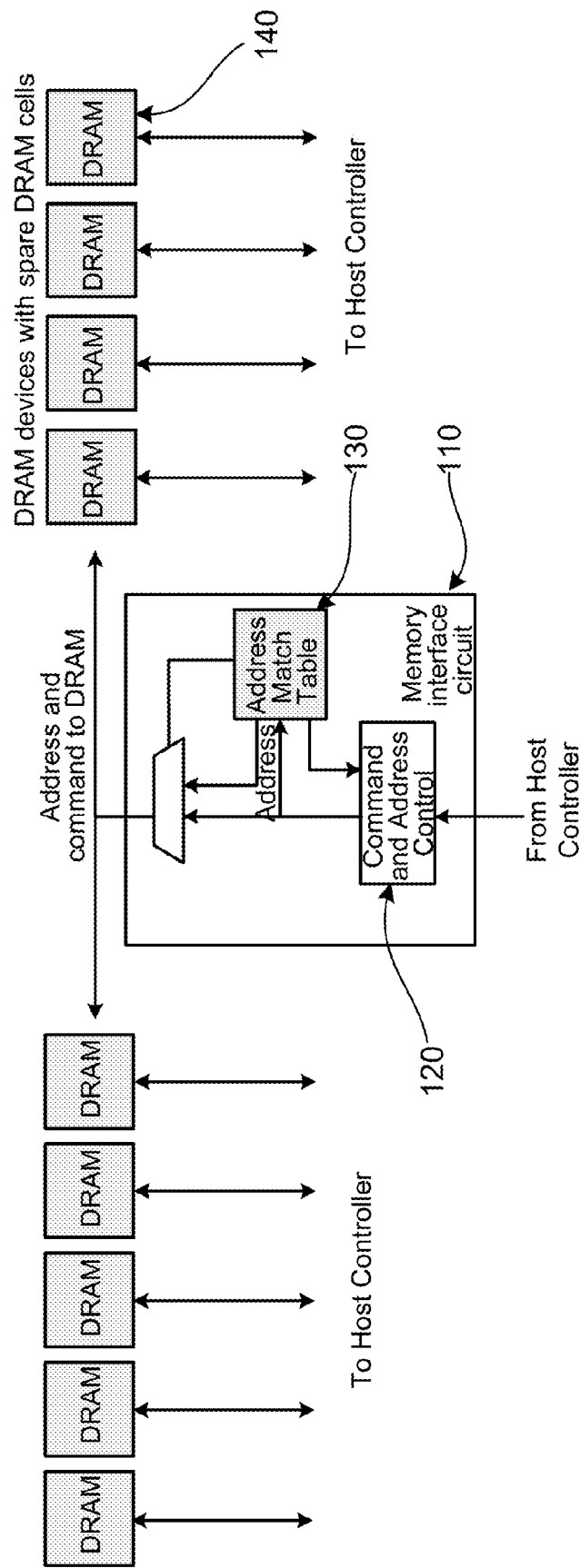
FIG. 11 is an illustration of using address match table in interface circuit and spare memory cells in DRAM devices to replace faulty cells according to an example of the present invention.

FIG. 11 is an illustration of using address match table in interface circuit and spare memory cells in DRAM devices to replace faulty cells according to an example of the present invention. This diagram is merely an example, which should not unduly limit the claims herein. One skilled in the art would recognize other variations, modifications, and alternatives. FIG. 11 shows the use of an enhanced interface circuit that, in combination with spare cells in DRAM devices, can function to replace faulty memory locations in the DRAM devices. In FIG. 11, an enhanced memory interface circuit, labeled as 110 is shown to contain a command and address control unit, labeled as 120, and the Address Match Table, labeled as 130. The enhanced memory interface circuit re-drives addresses and commands from the host controller to the DRAM devices, one of which is labeled as 140 in FIG. 11. The DRAM devices contain spare DRAM cells, the addresses of which the enhanced memory interface circuit can select and effect the replacement of faulty or weak storage cell locations.

Figure 12:
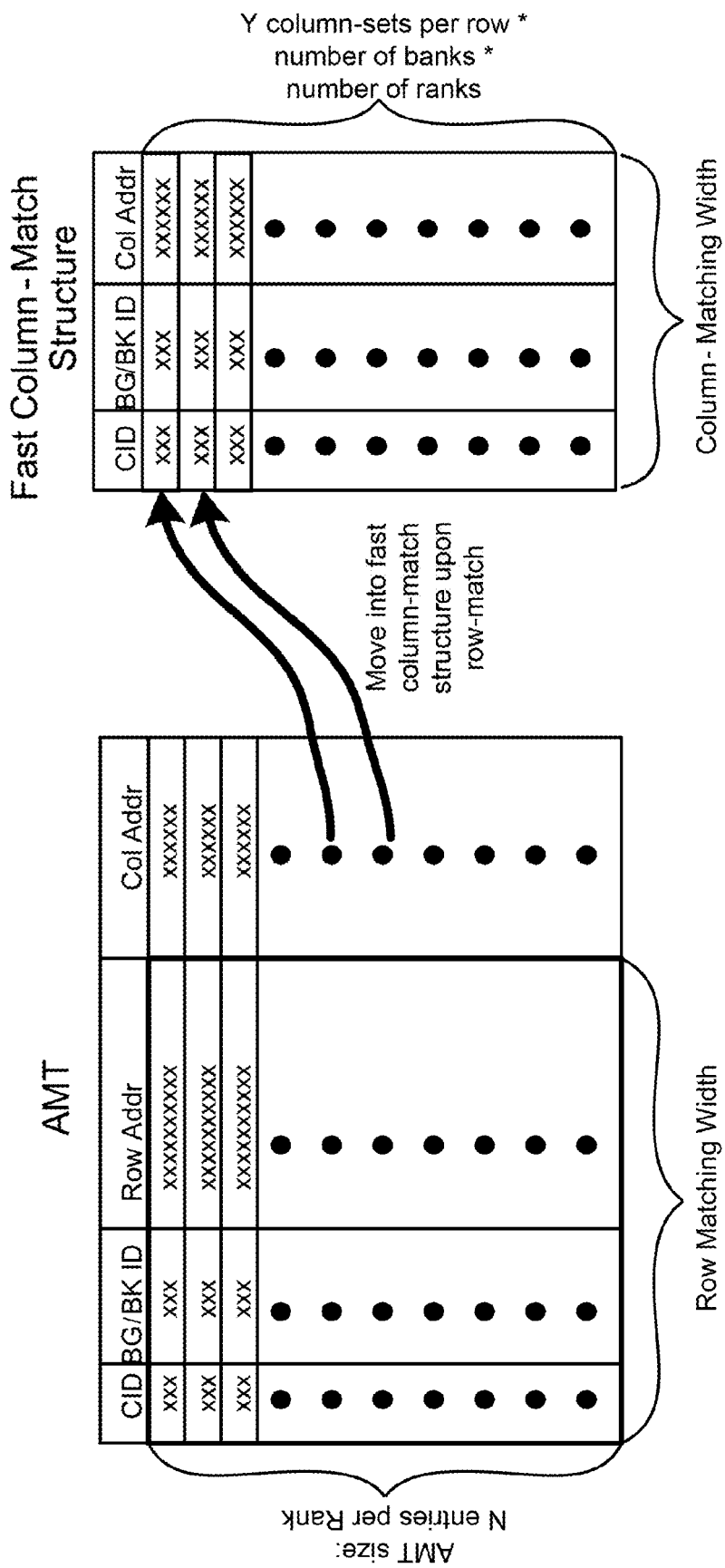
FIG. 12 is an illustrative example of the address match table according to an example of the present invention.

FIG. 12 shows an example of the Address Match Table, labeled as 130 in FIG. 11. The Address Match Table contains addresses of faulty memory storage cells. In the case of the Address Match Table shown in FIG. 12, the addresses are listed in terms of DRAM address formats: Rank ID, Bank ID, Row Address and Column Address. In other implementations, address fields for Chip ID (CID) and Bank Group ID may also be used. The addresses of faulty or weak memory storage cells contained in the Address Match Table may be determined by testing during manufacturing or special run-time testing. The entries in the Address Match Table may also be dynamically updated during runtime if it is determined that additional memory storage locations are weak or faulty. The function of the Address Match Table is to act as a filter of addresses and commands that flow through the enhanced memory interface circuit 110 (of FIG. 11).

The embodiments of the invention described herein are exemplary and numerous modifications, variations and rearrangements can be readily envisioned to achieve substantially equivalent results, all of which are intended to be embraced within the spirit and scope of the invention as defined in the appended claims.

In another example, the present techniques provide for supporting weak cell management in DRAM devices. It is believed that as DRAM process technology continue to advance, DRAM cell storage capacitance will continue to decrease and more and more DRAM storage cells will be unable to meet specified data retention time requirements. Furthermore, as the number of weak DRAM storage cell increases, DRAM devices as a whole will be unable to provide sufficient number of redundant rows and redundant columns to continue to effect repairs and present the façade of perfect storage devices. According to the present example, the techniques provide logic devices coupled with DRAM memory cells to help heal ailing DRAM devices and mitigate the ill effects of the weak DRAM cells. Further details of the present system and method can be found throughout the present specification and more particularly below.

EXAMPLE

Utilizing an Address Match Table in Memory Interface Circuit, Controlling Spare Memory Storage Cells to Dynamically Replace Faulty Storage Cells in Memory Devices, as Illustrated by FIG. 11

FIG. 11 shows an example of use of an enhanced interface circuit that, in combination with spare cells in DRAM devices, can function to replace faulty memory locations in the DRAM devices. As shown in FIG. 11, an enhanced memory interface circuit, labeled as 110 is shown to contain a command and address control unit, labeled as 120, and an Address Match Table, labeled as 130. The enhanced memory interface circuit re-drives addresses and commands from the host controller to the DRAM devices, one of which is labeled as 140 in FIG. 11. The DRAM devices contain spare DRAM cells, the addresses of which the enhanced memory interface circuit can select and effect the replacement of faulty or weak storage cell locations, as further illustrated by the Table shown in FIG. 13.

In an embodiment, the DRAM device may include a plurality of memory cell arrays, a plurality of switch blocks, and a plurality of sensing amplifying units. Each of the memory cell arrays includes at least one memory cell, and each memory cell may be connected to a word line and a bit line. Of course, other features exist with the DRAM device.

FIG. 13 shows an example of the Address Match Table (AMT), labeled as 130 in FIG. 11. In a specific embodiment, FIG. 13 shows that the Address Match Table contains addresses of faulty memory storage cells. The addresses are listed in terms of DRAM address formats: Rank ID, Bank ID, Row Address and Column Address. The reference spare ID can be "0" or "1," although there can be variations. The spare ID may be used to indicate data bus offset, or use as an offset ID as to select subset(s) of DRAM devices to respond to the selection of a spare location. For example, the offset ID may indicate that: only the left side of the memory module should be matched against the bad memory address, only the right side of the memory module should be matched against the bad memory address, the entire width (one rank) of the memory module should be matched against the bad memory address, or a single DRAM device should be matched against the bad memory address.

In other implementations, address fields for Chip ID (CID) and Bank Group ID may also be used. The addresses of faulty or weak memory storage cells contained in the AMT (130 in FIG. 11) may be determined by testing during manufacturing or special run-time testing. The entries in the AMT may also be dynamically updated during runtime if it is determined that additional memory storage locations are weak or faulty. The function of the AMT (130) is to act as a filter of addresses and commands that flow through the enhanced memory interface circuit 110 (of FIG. 11). In the case that a given memory access is matched to an entry in the AMT (130), the AMT (130) replaces the address of the memory access with the address of a spare memory location. In this manner, the existence of the faulty or weak memory address is hidden from the host memory controller, and the enhanced memory interface circuit 110 enables the memory devices to present a contiguous memory address space without faulty or weak cell locations, as further shown below in FIG. 14.

In an embodiment, the AMT (130 of FIG. 11) can be a data structure that is part of the address path of a Registering Clock Driver (RCD), or register, or a DRAM device, or a memory controller. The AMT contains the list of bad or weak memory cells, which can be a Weak Bit Address List (WBAL) or list of known Weak Bit Addresses (WBAs). These lists can be loaded into the AMT from a non-volatile storage during a system boot up. During normal operation, the AMT checks the addresses of commands that flow through the RCD for accesses to known bad or weak memory cells. In the case of a match, the AMT is able to initiate a cell repair or replacement process, which can include data replacement from Externally-Addressable-Spare-Columns (ESC) in the DRAM device. DRAM devices that can use such techniques include DDR4 RDIMM, LRDIMM with DDR4 SDRAM, or other like devices.

In another embodiment, the AMT can include multiple parallel AMTs to perform parallel operations of address matching and self-scrubbing or error detection and correction. For example, one AMT can perform a self-scrub operation, while another AMT continues to operate and respond to DRAM commands. Weak cell repair processes and cell optimization processes can also be conducted in parallel during normal operation. The number of AMTs in a given implementation can vary and can be determined be the maximum number of logical ranks that may be supported in a given memory system.

As an example, the each AMT can include a Row Address Match Table (RAMT) structure and a Column Address Match Table (CAMT) structure, which can be a Fast Column Address Match Table (FCAMT). The RAMT can contain a plurality of row addresses that are associated with a specific rank, a bank, and column addresses. When a row access command is received, the row address may be sent to every RAMT. In the case of a row address match, the column address associated with the row address can be moved to populate the associated entry in the CAMT structure. The row address tables can be configured to support 1, 2, 4, and 8, or more, ranks of DRAM devices with support from addresses buses for independent and parallel lookups.

Figure 14:
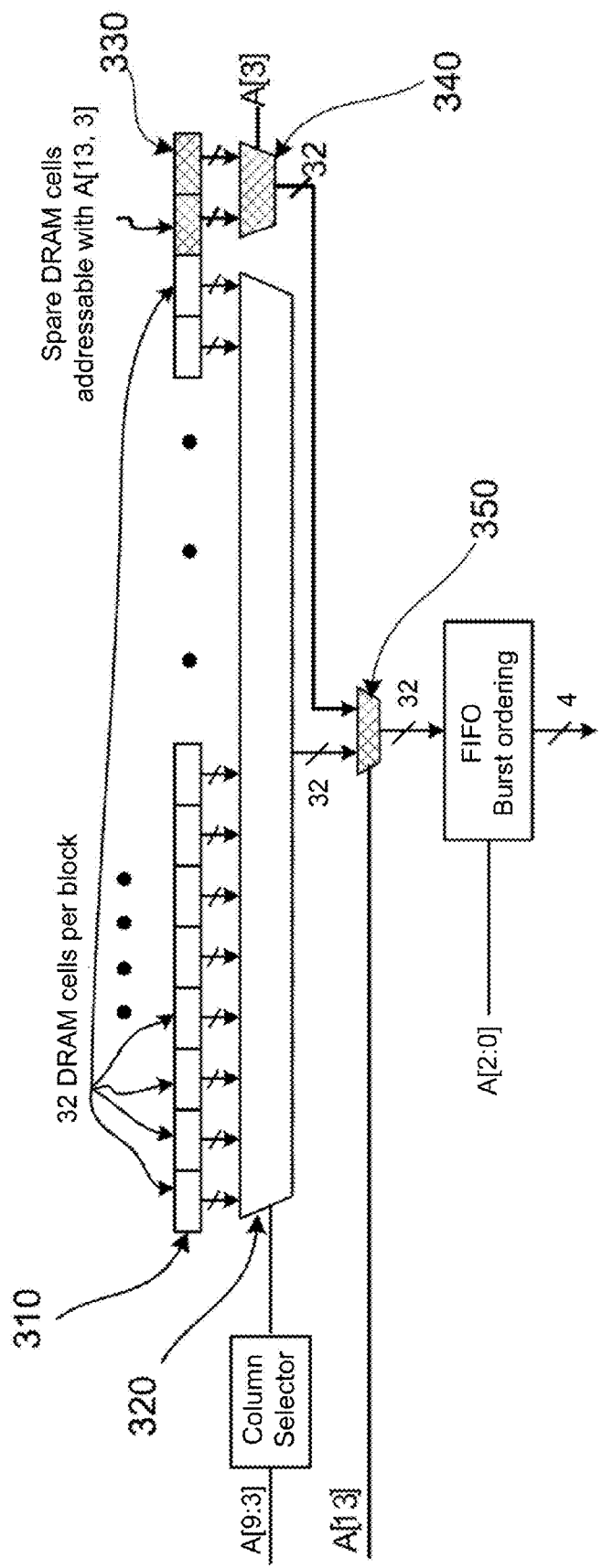
FIG. 14 illustrates a simplified diagram of spare memory cells in a DRAM device according to an embodiment of the present invention.

FIG. 14 shows an exemplary implementation of spare memory cells in a DRAM device. The diagram is merely an example, which should not unduly limit the claims herein. One skilled in the art would recognize other variations, modifications, and alternatives. As shown, the spare memory storage cells are arranged in terms of added columns for each row. In a specific embodiment, FIG. 14 shows a row of DRAM storage cells organized as blocks, with 32 DRAM cells per block. A block of 32 DRAM storage cells is labeled as 310 in FIG. 14. FIG. 14 also shows that column addresses A[9:3] are used to select between different blocks of DRAM storage cells through a block of circuits collectively labeled as a large multiplexer 320. FIG. 14 also shows the implementation of two blocks of spare DRAM cells, labeled as 330. FIG. 14 further illustrates that the two blocks of spare DRAM cells can be separately selected through the use of the column address A[3] through a multiplexor circuit labeled as 340. Finally, the column address A[13] is used to select between data from the baseline memory array or data from the spare memory cells through a multiplexer labeled as 350 in FIG. 14.

To prove the principle and operation of the present techniques, several examples have been presented. These examples are merely for illustration purposes and should not unduly limit the scope of the claims herein. One of ordinary skill in the art would recognize many variations, alternatives, and modifications.

To assist the reader, the following terms are defined as examples.

AMT: Address Match Table
CID: Chip ID
IFR: In-Field Repair
LRDIMM: Load-Reduced Dual Inline Memory Module
MB: Memory Buffer
MemBIST: Software tool to generate built in self test blocks for a memory matrix as a
  VHDL model for the whole memory system.
RCD: Registering Clock Driver, Also known more simply as the "Register"
RDIMM: Registered Dual Inline Memory Module
RID: Rank ID
SPD: Serial Presence Detect
VRT: Variable Retention Time
WBA: Weak Bit Address
WBAL: Weak Bit Address List
WCM: Weak Cell Management In an example, techniques include a method that is provided within a framework wherein DRAM devices are characterized, weak cells within the DRAM devices are detected, their address locations stored in non-volatile memory locations, and the subsequent usage of the WBA list to effect dynamic repairs that are transparent to the host memory controller. The section on MemBIST will provide descriptions of testing algorithms to detect weak cells, and the section on WBAL storage format will specify their storage format in non-volatile memory, and the sections that describe specific repair concepts will detail the usage of the WBAL to effect weak cell management.

In another example, the present description provides a high level architectural specification that is independent of specific DRAM types, specific DIMM types, and specific weak bit replacement concepts. It is intended that this specification will act as the master specification from which an implementation-specific architectural specification may be quickly derived.

In yet another example, the Externally-Addressable-Spare-Columns-in-DRAM concept is designed for implementation on a DDR3 or DDR4 Register DIMM (RDIMM) or LRDIMM. The Externally-Addressable-Spare-Columns-in-DRAM concept also utilizes a known Weak Bit Address List (WBAL) stored in one or more Address Match Tables (AMTs) to compare against addresses of DRAM commands that flow through the Address and Command Path of the RDIMM or LRDIMM. In the case that a match to a known Weak Bit Address, the AMT replaces the column-address of the Column-Access command with a column-address to a set of spare columns in the DRAM devices. The spare-columns are used to provide reliable storage locations for data in place of columns with known faulty or weak DRAM storage cells.

Figure 15:
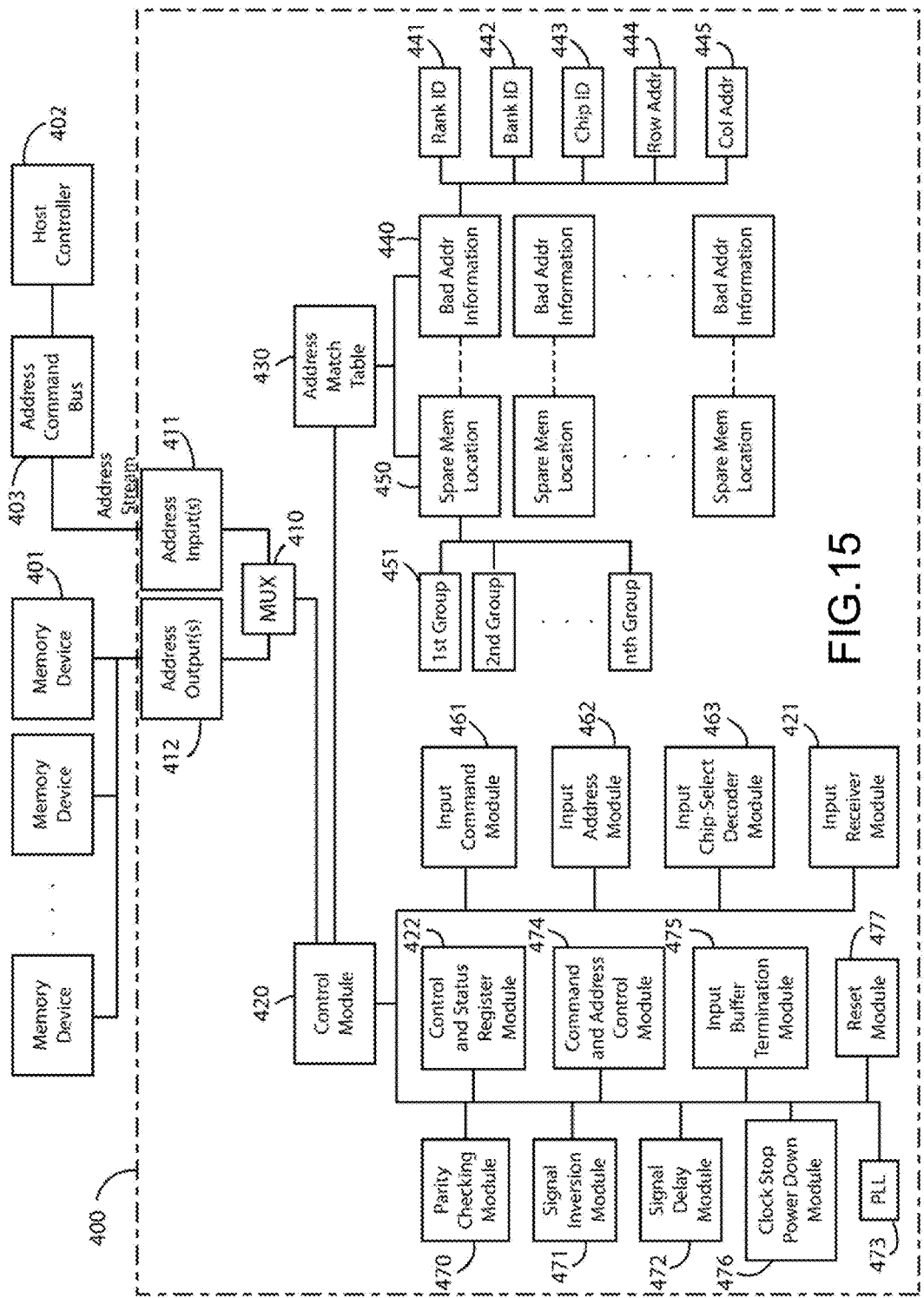
FIG. 15 illustrates a simplified block diagram of a memory interface device according to an embodiment of the present invention.

FIG. 15 illustrates a DDR4 Registered DIMM where the DDR4 Register has been modified to incorporate one or more AMTs according to an embodiment of the present invention. The diagram is merely an example, which should not unduly limit the claims herein. One skilled in the art would recognize other variations, modifications, and alternatives. As shown, he AMTs check addresses of DRAM commands as the DRAM commands flow through the DDR4 Register against known WBA locations. In the case of an address match, the DDR4 Register dynamically replaces the column-address of the column-access command with the address of a spare column in DRAM devices.

To facilitate the implementation of the Spare-Columns-in-DRAM concept the architectural description of the AMT and Externally-Addressable-Spare-Columns-in-DRAM may be found in the following sections (1) Address Match Table; (2) Externally-Addressable-Spare-Columns-in-DRAM.

In an embodiment, the present invention provides a memory interface device. As shown in FIG. 15, the memory interface device 400 can include address input(s) 411, address output(s) 412, an address match table 430, a control module 420, and a multiplexer 410. In a specific embodiment, the memory interface device 400 can be selected from a register device, a buffer device, an advanced memory buffer, a buffer on-board, or the like and combinations thereof The address input(s) 411 can be configured to receive address information from an address stream from an address command bus 403 of a host controller 402, while the address output(s) 412 can be coupled to a plurality of memory devices 401 and be configured to drive address information. In a specific embodiment, the plurality of memory devices 401 can include a plurality of DRAM devices, Flash devices, or other like memory devices. Furthermore, the multiplexer 410 can be coupled to the address input 411 and the address output 412.

In an embodiment of the present invention, the address match table 430 can include an array of SRAM cells, or the like. In a specific embodiment, this address match table 430 includes a plurality of bad address information 440 and a plurality of spare memory locations 450. Each of the plurality of bad address information 440 can be associated with one of the plurality of spare memory locations 450. Each of the plurality of bad address information 440 can include a rank ID 441, a bank ID 442, a chip ID 443, a row address 444, and a column address 445. Additional parameters can also be included. Each of the plurality of spare memory locations 450 can include a plurality of memory groups 451, which can include a first column, second column, and an nth column. Row and bank configurations can also be used, as various numbers and configurations of the plurality of spare memory locations 450 can be used depending on design and related applications. The address match table 430 can be configured to receive the bad address information and can be configured to transfer the spare memory location to replace the bad address associated with the bad address information.

The control module 420 can be a command and address module, or the like. This control module 420 can be integrated with the address match table 430. In a specific embodiment, this control module 420 is configured to determine address information from an address stream from an address command bus 403 coupled to a host controller 402 during a run time operation. This control module 420 is also configured to compare each address from the address steam 403 and configured to determine whether each address matches with a stored address in the address match table 430 to identify a bad address. The control module 420 further is configured to replace the bad address with the revised address of the spare memory location 450.

In another specific embodiment, the control module 420 includes an input receiver module 421 or a control and status register module 422. The control module 420 also includes an input command 461, an input address 462, and an input chip-select decoder module 463. Other components, such as a parity checking module 470, a signal inversion module 471, a signal delay module 472, a PLL (Phase-locked loop) 473, a command and address control module 474, an input buffer termination module 475, a clock stop power down module 476, a reset module 477, and the like, can also be included with the memory interface device 400.

In a specific embodiment, the memory interface device 400 can be coupled to a plurality of DRAM devices. Each of these DRAM devices can include a plurality of address inputs, a plurality of control inputs, a plurality of data input/outputs, a plurality of memory arrays, and a spare group. Each of the plurality of memory arrays can include a plurality of memory cells, each of which can be coupled to a data input/output. The spare group can include a plurality of spare memory cells. Each of these spare memory cells can be externally addressable using the address match table. Furthermore, the spare group can include a spare row, a spare column, or a spare bank.

Figure 16:
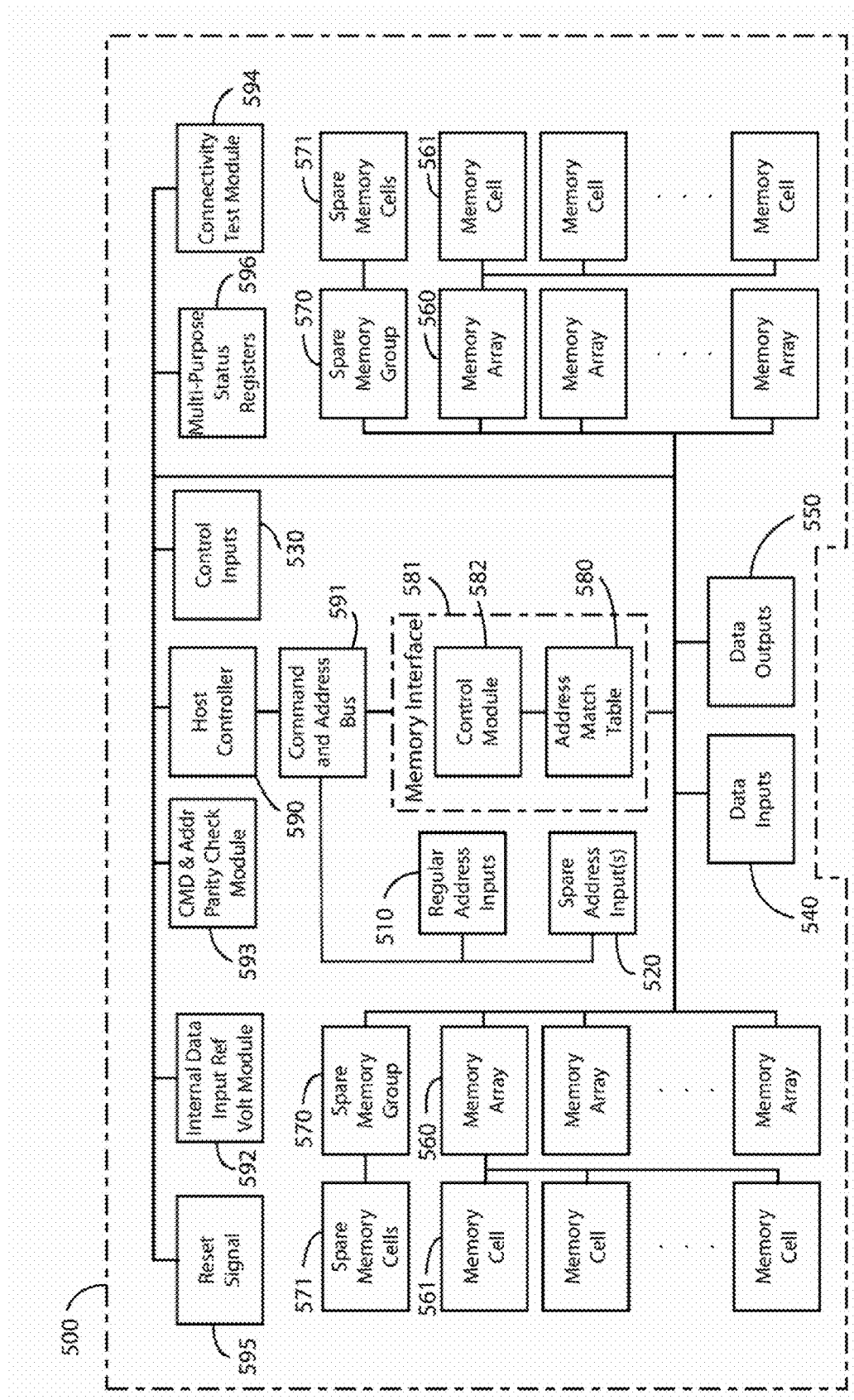
FIG. 16 illustrates a simplified block diagram of a memory integrated circuit device according to an embodiment of the present invention.

FIG. 16 illustrates a simplified block diagram of a memory integrated circuit device according to an embodiment of the present invention. The diagram is merely an example, which should not unduly limit the claims herein. One skilled in the art would recognize other variations, modifications, and alternatives. As shown, the memory integrated circuit device 500 includes a plurality of regular address inputs 510, at least one spare address 520 configured for a selected mode or an unselected mode, a plurality of control inputs 530, a plurality of data inputs 540, a plurality of data outputs 550, a plurality of memory arrays 560, and a spare group of memory cells 570.

In a specific embodiment, each of the plurality of memory arrays 560 includes a plurality of memory cells 561. Each of these memory cells 561 can be coupled to a data input/output 540/550. Also, the spare group of memory cells 570 can include a plurality of spare memory cells 571. The spare group of memory cells 571 can include a spare column, a spare row, a spare bank, or the like. Each of these memory cells 571 can be externally addressable using an address match table 580 and can be configured with the spare address input 520. The spare address input 520 can be coupled to the address match table 580 to access the spare memory cells 571. The address match table 580 can be provided within a memory interface device 581 with a control module 582. This memory interface device 581 can be similar to the memory interface device 400 described for FIG. 15 above. In a specific embodiment, the spare address input 520 can include one of three unused column address inputs A11, A13, and A17.

In a specific embodiment, the plurality of spare memory cells 571 can be accessed from the group of memory cells 570 using the spare address input 520 during the selected mode. During a read operation, data from the accessed spare memory cell 571 can be transferred to one of the plurality of data outputs 550. During a write operation, data from one of the plurality of data inputs 540 can be transferred into the accessed spare memory cell 571. During the unselected mode, the spare address input 520 can remain inactive while the plurality of regular address inputs 510 remains active.

Also, the spare group of memory cells 570 can include various configurations of spare columns and spare address inputs. For example, the spare group 570 can include first through seventh spare columns, and the spare address inputs can include first through third spare address inputs. Or, the spare group can include first through third spare columns, and the spare address inputs can include a first and second spare address inputs. Other variations, modifications, and alternatives to these configurations can be used.

In another specific embodiment, the memory integrated circuit device 500 also includes an encoded command and address bus 591 having a shared command signal and an address signal, an internal data input reference voltage circuit 592, a command and address parity checking circuit 593 a set of circuits designed to support connectivity testing 594, a reset input signal 595, a set of multi-purpose status registers 596 configured to be read out, or the like and combinations thereof. These modules and circuits can be coupled to a host controller 590. Those of ordinary skill in the art will recognize other variations, modifications, and alternatives.

Many benefits are achieved by way of the present invention over conventional embodiments and techniques. For example, embodiments of a memory IC device can have improved performance and lifetime. Embodiments of a memory interface device can facilitate the "repair" of bad or faulty memory cells, or even undesirable memory cells due to aging, deterioration, or the like. Spare memory cells from a memory IC device can be rerouted via a memory interface device upon detection of predetermined characteristics of memory cell to be replaced. These implementations provide several means of maintaining or improving memory performance, which can be tailored depending on various hardware and/or software requirements of specific applications.

In an example, the present invention provides a method for operating a memory interface device, as outlined below.
1. Receive, at an address input(s) of a memory interface device, address information from an address stream of a host computer;
2. Process the address stream from an address command bus coupled to the host controller during a run time operation;
3. Compare successively each address from the address stream from information in an address match table to determine to whether an address matches with a stored address in an address match table;
4. Identify a bad address provided in the address match table;
5. Replace the bad address with a revised address of a spare memory location;
6. Transfer the revised address to a multiplexer coupled to the address output;
7. Drive address information from an address output(s) of the memory interface device to a plurality of memory devices; and
8. Perform other steps, as desired.

As shown, the present method has a sequence of steps, which can be varied, modified, replaced, reordered, expanded, contracted, or any combinations thereof. That is, the method repeats any of the above steps. Such steps may be performed alone or in combination with others, which are described or not even described. The steps can be performed in the order shown or in other orders, if desired. The steps also can be performed using a combination of hardware and software using other process steps. The steps also can be performed using hardware or other processes implemented using software and the like. Of course, there can be many other variations, modifications, and alternatives. Further details of the present method can be found throughout the present specification and more particularly below.

Figure 17:
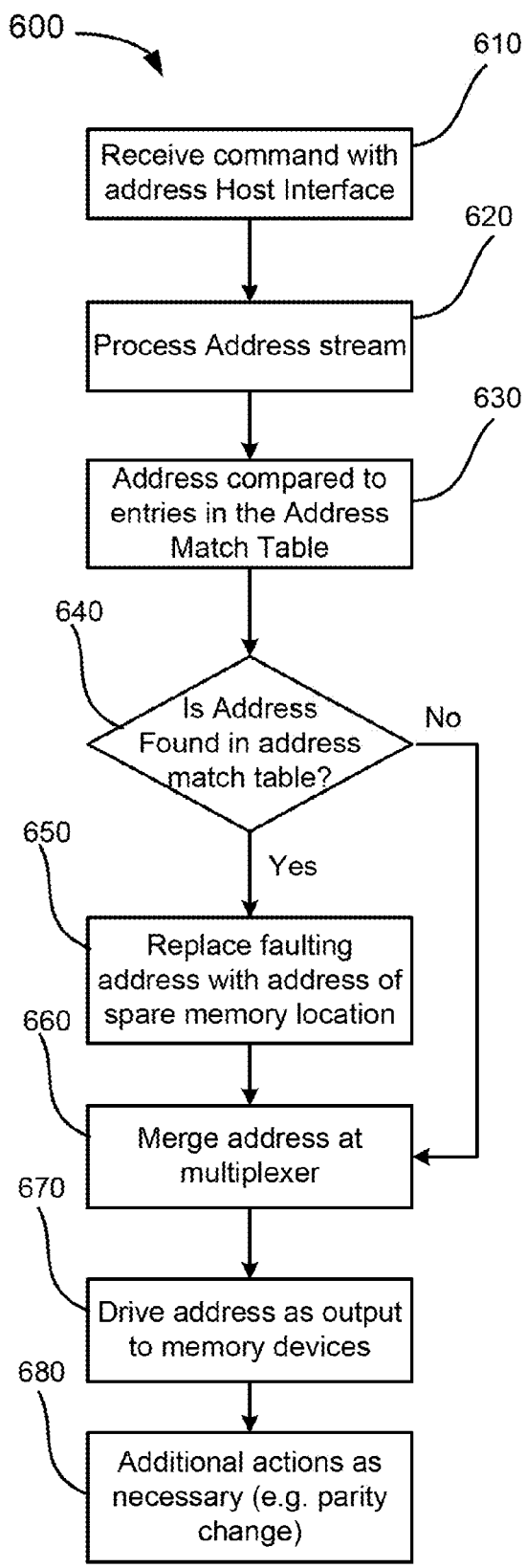
FIG. 17 illustrates a simplified flow diagram showing a method for operating an address match process for replacing a bad cell with a spare cell according to an embodiment of the present invention.

FIG. 17 illustrates a simplified flow diagram showing a method for operating an address match process for replacing a bad cell with a spare cell according to an embodiment of the present invention. As shown, the method 600 can begin with receiving, at address input or inputs of a memory interface device, address information from an address stream of a host computer, step 610. This memory interface device can be coupled to a host computer. For example, the memory interface device can be the device 400 shown in FIG. 15. The memory interface device can be selected from a register device, a buffer device, an advanced memory buffer, or a buffer on-board. These memory devices can include a plurality of DRAM devices, Flash devices, or other like devices and combinations thereof During a run time operation, the address stream from an address command bus coupled to the host controller can be processed, step 620. Each address from the address stream can be compared successively to determine whether an address matches with a stored address in an address match table, step 630. The address match table can include a plurality of SRAM cells and can include a plurality of bad address information and a plurality of spare memory locations. Each of these bad address locations can be associated with one of the spare memory locations. Each of the bad address information can include a rank ID, a bank ID, a chip ID, a row address, and a column address. Each of the spare memory locations can include one or more memory groups, which can include columns, rows, or banks, and the like. In a specific embodiment, each of the spare memory locations can include a first, second, and an nth column.

A bad address in the address match table can be identified, step 640, and can be replaced with a revised address of a spare memory location, step 650. The revised address can be transferred to a multiplexer coupled to the address output, step 660. The address match table can be configured to receive bad address information and transfer the spare memory location to replace the bad address associated with the bad address information. Also, method 600 can include driving address information from an address output or outputs of the memory interface device to a plurality of memory devices, step 670.

In a specific embodiment, the comparing, identifying, and replacing can be under control of a control module. This control module is integrated with the address match table and further includes an input receiver module, a control and status register module, an input command module, and input address module, and an input chip-select decoder module, and other like modules. Further details regarding components of these devices and process are described previously for FIG. 11 and FIGS. 13-16. Furthermore, other steps can be performed as desired according to various specifications and applications, step 680.

Figure 18:
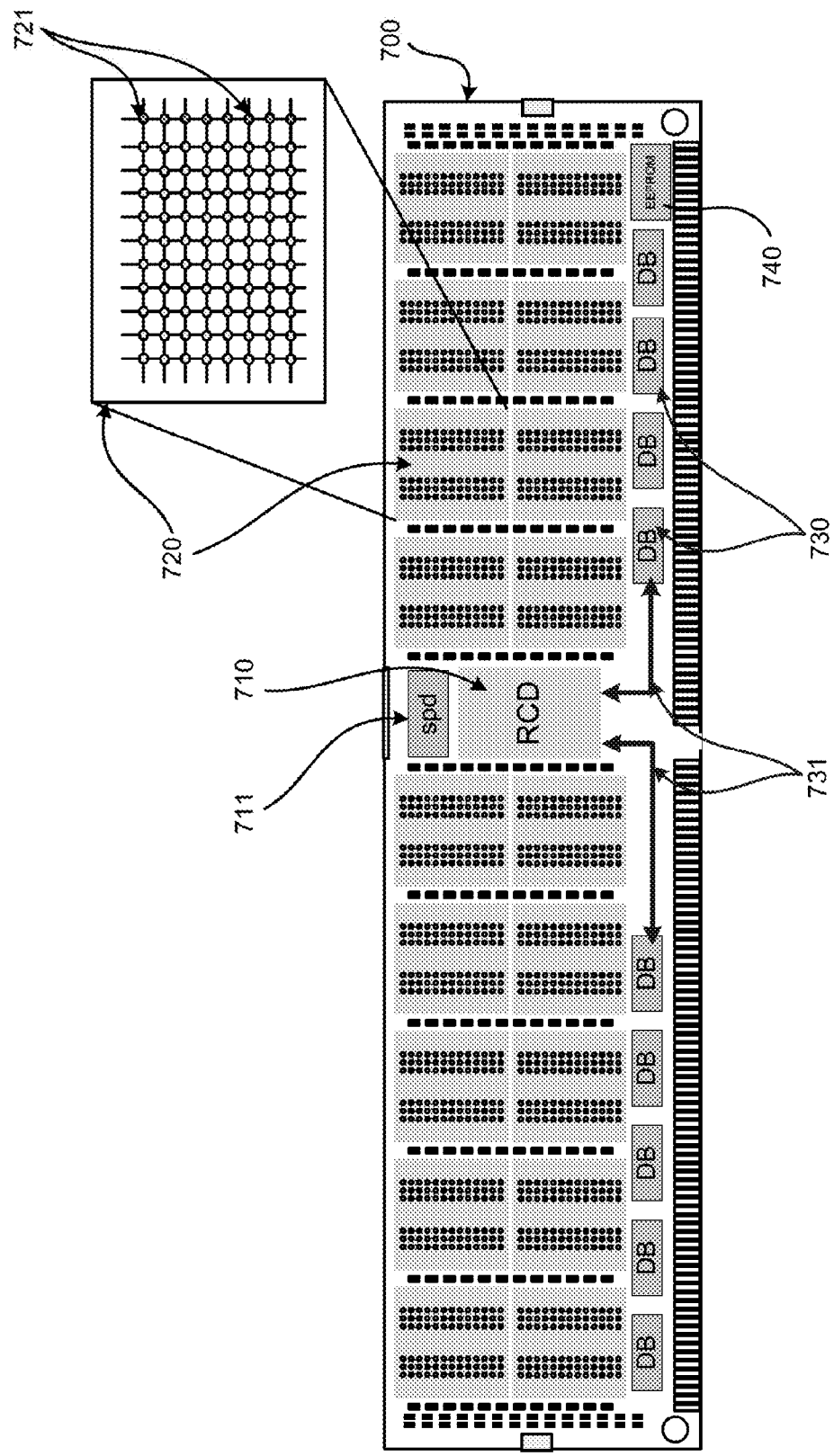
FIG. 18 illustrates a simplified diagram of a memory integrated circuit device according to an embodiment of the present invention.

FIG. 18 illustrates a simplified diagram of a memory integrated circuit device according to an embodiment of the present invention. The diagram is merely an example, which should not unduly limit the claims herein. One skilled in the art would recognize other variations, modifications, and alternatives. As shown, memory integrated circuit device 700 can include a Registering Clock Driver (RCD) module 710. The RCD 710 is coupled to a plurality of memory arrays 720 and a plurality of data buffers (DBs) 730 plus a persistent storage device 740. The data buffers 730 are coupled to the RCD 710 via the control buses 731. The persistent storage device 740 can be a non-volatile memory such as an EEPROM (Electrically Erasable Programmable Read-Only Memory) for storing the WBAL which is ready to be loaded into the AMT. The memory integrated circuit device 700 includes a serial presence detect (SPD) module 711, which can contain SPD data to provide a standardized method to access information about the memory arrays.

The RCD 710 can include or be coupled to a host controller and an address match table module. As described previously, a memory interface device can be provided within the address path of the RCD 710. The memory module 740, which can be a non-volatile memory such as an EEPROM (Electrically Erasable Programmable Read-Only Memory), stores the WCL to be loaded into the AMT. With the WCL, bad or weak memory cells can be replaced with spare memory cells 721 within the memory arrays 720.

Various example embodiments as described with reference to the accompanying drawings, in which embodiments have been shown. This inventive concept may, however, be embodied in many different forms and should not be construed as limited to the embodiments set forth herein. Rather, these embodiments are provided so that this disclosure is thorough and complete, and has fully conveyed the scope of the inventive concept to those skilled in the art. Like reference numerals refer to like elements throughout this application.

It has been understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the inventive concept. As used herein, the term "and/or" includes any and all combinations of one or more of the associated listed items.

It has be understood that when an element is referred to as being "connected" or "coupled" to another element, it can be directly connected or coupled to the other element or intervening elements may be present. In contrast, when an element is referred to as being "directly connected" or "directly coupled" to another element, there may be no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the inventive concept. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other.

Unless otherwise defined, all terms (including technical and scientific terms) used herein have the same meaning as commonly understood by one of ordinary skill in the art to which this inventive concept belongs. It has been be further understood that terms, such as those defined in commonly used dictionaries, should be interpreted as having a meaning that is consistent with their meaning in the context of the relevant art and will not be interpreted in an idealized or overly formal sense unless expressly so defined herein.

I claim:

1. A method for operating a dynamic random access memory (DRAM) device to provide a concurrent active/pre-charge cycle for a weak DRAM cell and obtain a longer write recovery time transparent to a memory controller coupled to the DRAM device, the method comprising:
receiving a write command to a first DRAM cell from a host controller, the first DRAM cell being provided in a bank, the bank being one of a plurality of banks in the DRAM device, the bank comprising a plurality of sub-arrays;
receiving data associated with the write command from the host controller to the first DRAM cell to store the data into a first cell capacitor of the first DRAM cell at a first voltage level;
controlling the bank using a registering clock driver and controlling another bank using the register clock driver of the DRAM device, the registering clock driver including a per-bank write-recovery counter;
initiating the per-bank write-recovery counter to count a measured time duration from a first time when the data is available at a data interface of the DRAM device to a second time when a pre-charge command is received by an address interface of the DRAM device;
comparing the measured time with a predetermined time from the first time;
storing a first address in a row address register for the first DRAM cell, wherein storing the first address in the row address register for the first DRAM cell is provided upon determining a state of a fused bit that indicates a presence of a weak bit in the first address;
receiving an activate command for a second DRAM cell associated with the bank comprising the plurality of subarrays, the second DRAM cell comprising a second address;
determining whether the first address and the second address are associated with a particular subarray in the bank; and
initiating an activation process associated with the activate command for the first DRAM cell when the first address and the second address are not associated with the particular subarray in the bank.

2. The method of claim 1 wherein the storing of the first address is provided when the measured time is less than the predetermined time.

3. The method of claim 1 wherein the predetermined time is provided by a manufacturer of the DRAM device.

4. The method of claim 1 wherein the first DRAM cell is one of a plurality of DRAM cells in a first subarray.

5. The method of claim 1 wherein the activation process introduces an additional charge to a first cell capacitor provided in the first DRAM cell to change a voltage level of the first cell capacitor from the first voltage level at either an incompletely charged or discharged state to a second voltage level, the second voltage level being associated with a charged or discharged state.

6. The method of claim 1 further comprising, alternatively, if the first address and the second address are associated with the particular subarray in the bank, not initiating an activation process associated with the activate command for the first DRAM cell.

7. The method of claim 1 wherein the activate command comprises applying a high voltage to a word line associated with the second DRAM cell, charge-sharing between the second DRAM cell and a bit line associated with the second DRAM cell; and initiating a charging or discharging device to configure the second DRAM cell in a charged or discharged state.

8. The method of claim 1 wherein the first DRAM cell comprises a first dimension of 40 nm and less, and a second dimension of 60 nm and less.

9. The method of claim 1 wherein the determining whether the first address and the second address are associated with a particular subarray in the bank and initiating the activation process associated with the activate command for the first DRAM cell is transparent to the host controller.

10. The method of claim 1 further comprising performing a read command or a write command to another memory cell only in the particular subarray associated with the second address and not to the subarray associated with the first address during a portion the activation process associated with the activate command for the first DRAM cell.

11. The method of claim 1 further comprising initiating a precharge command to each of the particular subarray of the second address and the subarray of the first address after the activation process associated with the activate command for the first DRAM cell has been completed.

12. The method of claim 1 further comprising initiating a precharge command, the precharge command being received by an address interface of the DRAM device in association with a write command including a bit(s) that indicates an auto-precharge operation such that a timing associated between the auto-precharge operation and a data write associated with the write command is predetermined by a specification.

* * * * *